United States Patent
Kawashima

(10) Patent No.: US 11,948,866 B2
(45) Date of Patent: Apr. 2, 2024

(54) SEMICONDUCTOR DEVICE

(71) Applicant: ROHM CO., LTD., Kyoto (JP)

(72) Inventor: Nahoko Kawashima, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 256 days.

(21) Appl. No.: 17/452,864

(22) Filed: Oct. 29, 2021

(65) Prior Publication Data

US 2022/0139813 A1    May 5, 2022

(30) Foreign Application Priority Data

Nov. 4, 2020 (JP) ................... 2020-184220

(51) Int. Cl.
| | |
|---|---|
| *H01L 23/495* | (2006.01) |
| *H01L 23/31* | (2006.01) |
| *H01L 23/538* | (2006.01) |
| *H01L 25/07* | (2006.01) |
| *H01L 27/082* | (2006.01) |

(52) U.S. Cl.
CPC ........ *H01L 23/49531* (2013.01); *H01L 23/31* (2013.01); *H01L 23/5386* (2013.01); *H01L 25/072* (2013.01); *H01L 27/082* (2013.01)

(58) Field of Classification Search
CPC ............... H01L 23/3107; H01L 23/495; H01L 23/49503; H01L 23/4951; H01L 23/49541; H01L 23/49568; H01L 23/49575; H01L 27/082
See application file for complete search history.

(56) References Cited

U.S. PATENT DOCUMENTS

| | | | | |
|---|---|---|---|---|
| 8,987,063 | B2 * | 3/2015 | Harata | H01L 23/28 257/787 |
| 9,070,659 | B2 * | 6/2015 | Yasunaga | H01L 23/49513 |
| 11,469,164 | B2 * | 10/2022 | Fehler | H01L 24/96 |
| 11,562,949 | B2 * | 1/2023 | Thompson | H01L 24/17 |
| 2008/0181325 | A1 * | 7/2008 | Park | H04L 25/0232 375/260 |
| 2008/0191325 | A1 * | 8/2008 | Shirasaka | H05K 1/0206 257/E23.06 |

FOREIGN PATENT DOCUMENTS

| | | | | |
|---|---|---|---|---|
| DE | 102005063532 | B3 * | 3/2022 | ............ H01L 24/16 |
| JP | 2002064106 | A | 2/2002 | |

\* cited by examiner

*Primary Examiner* — Eduardo A Rodela
(74) *Attorney, Agent, or Firm* — HAMRE, SCHUMANN, MUELLER & LARSON, P.C.

(57) ABSTRACT

A semiconductor device includes: first and second semiconductor elements, each of which has first and second electrodes; a first lead mounting the first semiconductor element; a second lead mounting the second semiconductor element; a sealing resin covering the first and second semiconductor elements; a third lead disposed apart from the first and second leads in a y direction, exposed from the sealing resin, and electrically connected to the first electrode of the first semiconductor element; a fifth lead disposed apart from the first and second leads on the opposite side to the third lead, exposed from the sealing resin, and electrically connected to the second electrode of the first semiconductor element; and a sixth lead disposed apart from the first and second leads on the same side as the fifth lead, exposed from the sealing resin, and electrically connected to the second electrode of the second semiconductor element.

17 Claims, 19 Drawing Sheets

SEMICONDUCTOR DEVICE

CROSS-REFERENCE TO RELATED APPLICATION

This application is based upon and claims the benefit of priority from Japanese Patent Application No. 2020-184220, filed on Nov. 4, 2020, the entire contents of which are incorporated herein by reference.

TECHNICAL FIELD

The present disclosure relates to a semiconductor device on which a semiconductor element is mounted.

BACKGROUND

Inverter devices used in electric vehicles, hybrid vehicles, and the like include switching elements such as MOSFETs (Metal Oxide Semiconductor Field Effect Transistors) and IGBTs (Insulated Gate Bipolar Transistors), and a gate driver circuit for driving the switching elements. The gate driver circuit includes a drive element and a buffer circuit that amplifies a drive signal output by the drive element and outputs the amplified drive signal to the switching elements. Some buffer circuits may include an NPN type bipolar transistor and a PNP type bipolar transistor, in which base electrodes of both of the transistors are connected to each other and emitter electrodes of both of the transistors are connected to each other. For miniaturization of the gate driver circuit, it is expected that individual components included in the buffer circuit would be miniaturized. Use of a semiconductor device, in which a semiconductor element as an NPN type bipolar transistor and a semiconductor element as a PNP type bipolar transistor are mounted on a lead frame and covered with a sealing resin, may contribute to miniaturization of the gate driver circuit.

A semiconductor device including two bipolar transistors is known. The semiconductor device includes a first transistor element, a second transistor element, a lead frame, and a sealing resin. In the semiconductor device, a lead electrically connected to a base electrode of the first transistor element, a lead electrically connected to a collector electrode of the first transistor element, and a lead electrically connected to a collector electrode of the second transistor element are exposed from one side of the sealing resin. Further, in the semiconductor device, a lead electrically connected to an emitter electrode of the first transistor element, a lead electrically connected to a base electrode of the second transistor element, and a lead electrically connected to an emitter electrode of the second transistor element are exposed from the opposite side of the sealing resin. In this case, when the semiconductor device is mounted on a wiring board, both base electrodes are connected to each other by wirings on the wiring board, and both emitter electrodes are connected to each other by wirings on the wiring board, complicated wirings are required.

SUMMARY

Some embodiments of the present disclosure provide a semiconductor device capable of simplifying wirings of a wiring board on which a semiconductor device is mounted.

According to one embodiment of the present disclosure, there is provided a semiconductor device including: a first semiconductor element and a second semiconductor element, each of which is a switching element and has an element main surface and an element back surface facing opposite to each other in a thickness direction, and a first electrode and a second electrode arranged on the element main surface; a first lead on which the first semiconductor element is mounted, the first lead being electrically connected to the first semiconductor element; a second lead on which the second semiconductor element is mounted, the second lead being electrically connected to the second semiconductor element; a sealing resin that covers the first semiconductor element and the second semiconductor element; a first terminal disposed apart from the first lead and the second lead in a first direction orthogonal to the thickness direction, exposed from the sealing resin, and electrically connected to the first electrode of the first semiconductor element; a second terminal disposed apart from the first lead and the second lead on the same side as the first terminal in the first direction, exposed from the sealing resin, and electrically connected to the first electrode of the second semiconductor element; a third terminal disposed apart from the first lead and the second lead on the opposite side to the first terminal in the first direction, exposed from the sealing resin, and electrically connected to the second electrode of the first semiconductor element; and a fourth terminal disposed apart from the first lead and the second lead on the same side as the third terminal in the first direction, exposed from the sealing resin, and electrically connected to the second electrode of the second semiconductor element.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
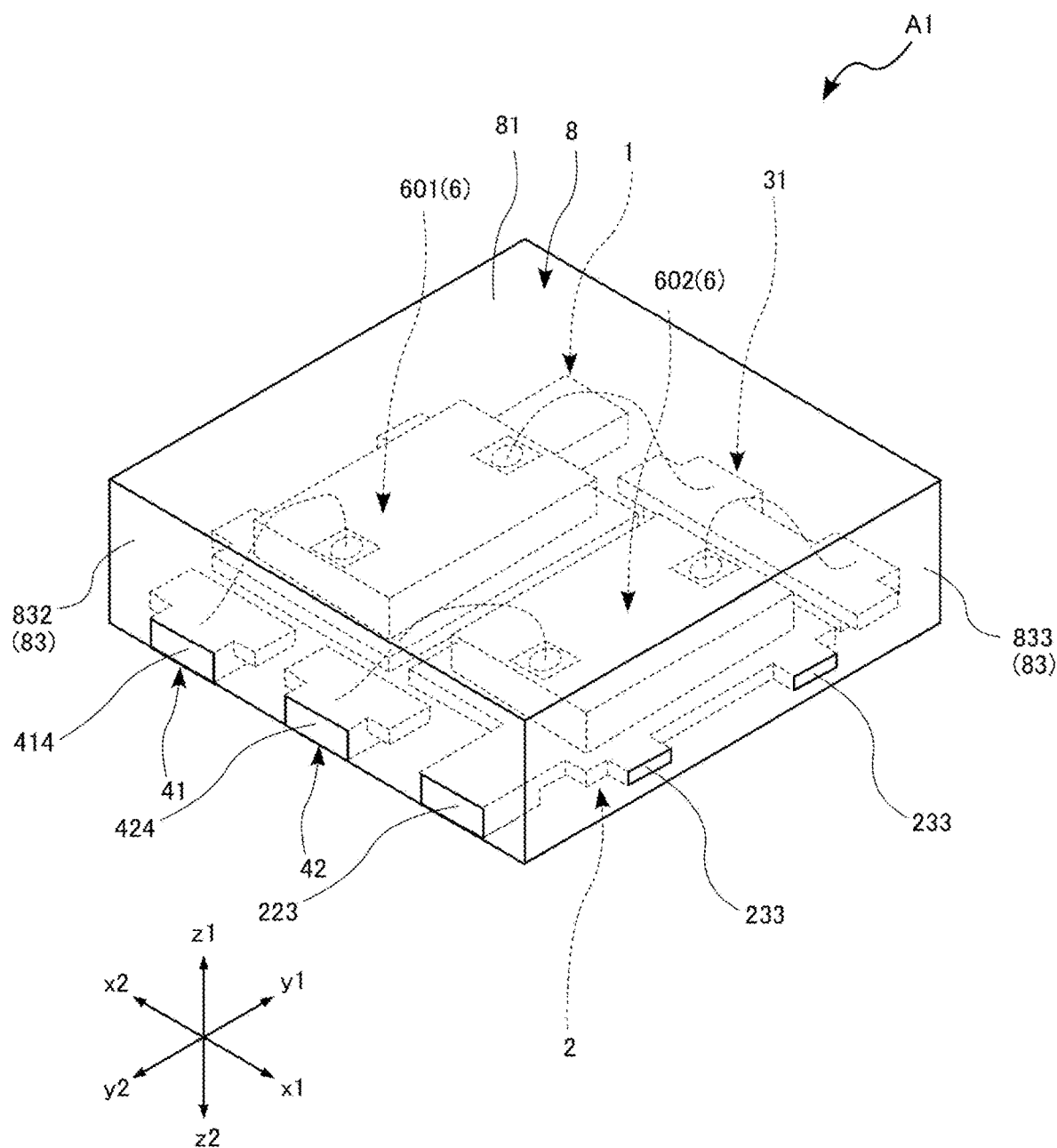
FIG. 1 is a perspective view showing a semiconductor device according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the present disclosure, the phases "a certain thing A is formed in another certain thing B" and "a certain thing A is formed on another certain thing B" include, unless otherwise specified, "a certain thing A is directly formed in another certain thing B" and "a certain thing A is formed on another certain thing B with other thing interposed between the certain thing A and the another thing B." Similarly, the phases "a certain thing A is placed in another certain thing B" and "a certain thing A is placed on another certain thing B" include, unless otherwise specified, "a certain thing A is directly placed in another certain thing B" and "a certain thing A is placed in another certain thing B with other thing interposed between the certain thing A and the another thing B." Similarly, the phase "a certain thing A is located on another certain thing B" includes, unless otherwise specified, "a certain thing A is located on another certain thing B in contact of the certain thing A with the another certain thing B" and "a certain thing A is located on another certain thing B with other thing interposed between the certain thing A and the another thing B." In addition, the phase "a certain thing A overlaps with another certain thing B when viewed in a certain direction" includes, unless otherwise specified, "a certain thing A overlaps entirely with another certain thing B" and "a certain thing A overlaps partially with another certain thing B."

First Embodiment

A semiconductor device A1 according to a first embodiment of the present disclosure will be described with reference to FIGS. 1 to 8. The semiconductor device A1 includes leads 1, 2, 31, 41, and 42, two semiconductor elements 6, wires 71 and 72, and a sealing resin 8. The semiconductor elements 6 include a semiconductor element 601 and a semiconductor element 602. The semiconductor device A1 is used in a gate driver circuit of an inverter device of, for example, an electric vehicle, a hybrid vehicle, or the like. The semiconductor device A1 functions as a buffer circuit that amplifies a drive signal output by a drive element (not shown) and outputs the drive signal to a switching element (not shown). The use and function of the semiconductor device A1 are not particularly limited. A package format of the semiconductor device A1 may be DFN (Dual Flatpack No-leaded). The package format of the semiconductor device A1 is not limited to DFN.

Figure 2:
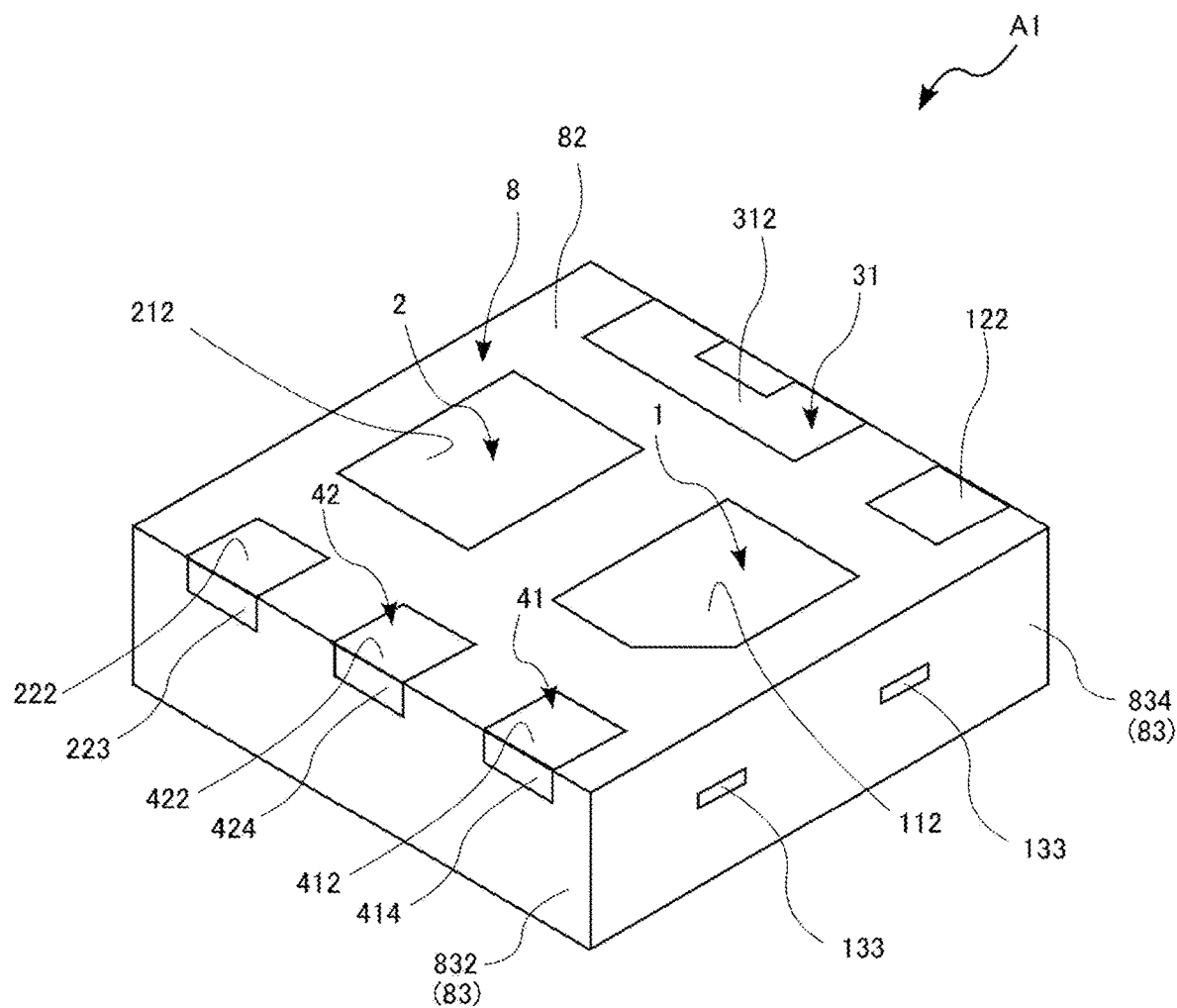
FIG. 2 is a perspective view showing the semiconductor device of FIG. 1, with a bottom side facing up.
Figure 2:
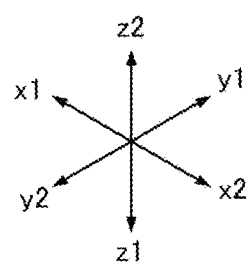
Figure 3:
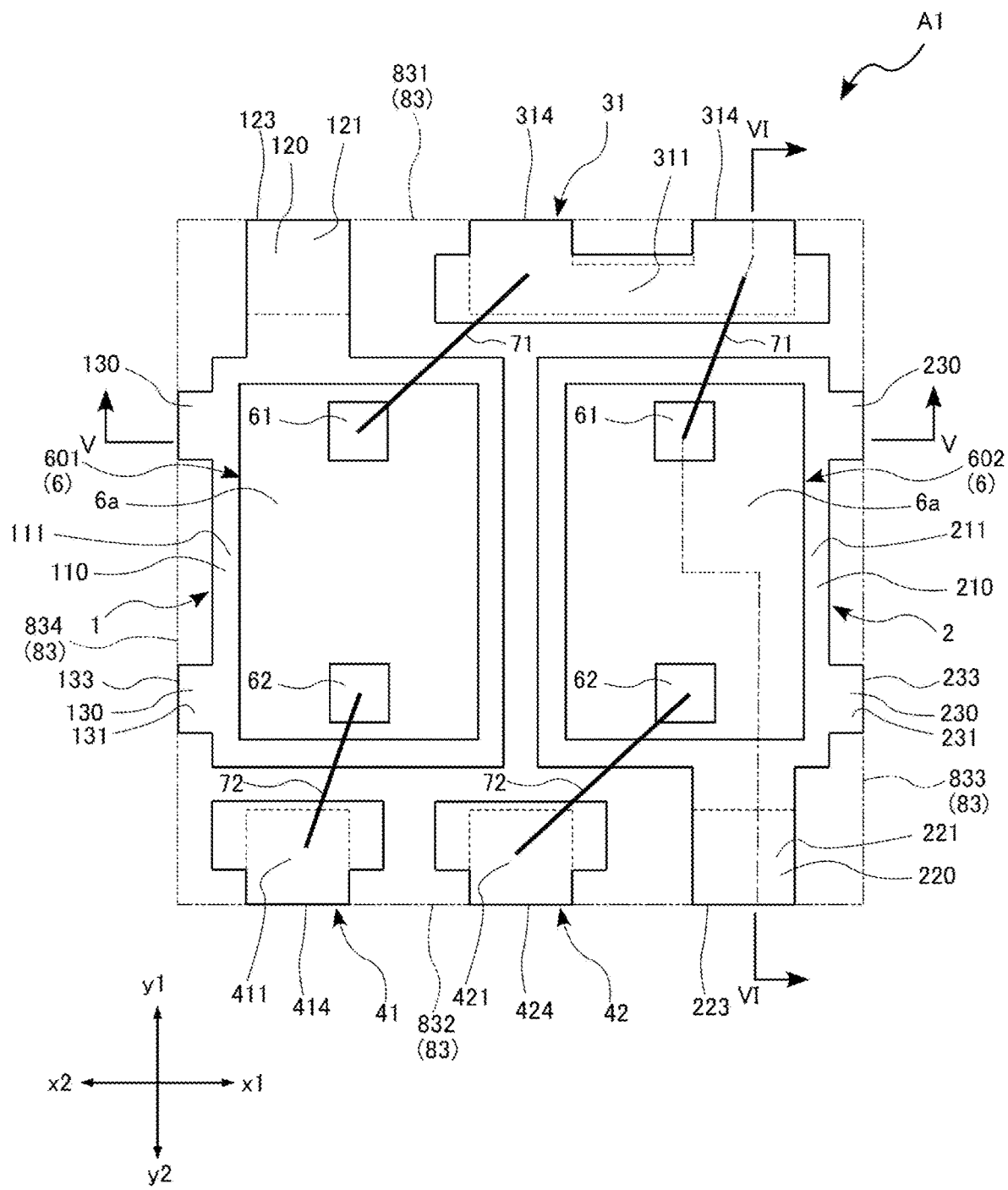
FIG. 3 is a plan view showing the semiconductor device of FIG. 1, which is transparent to a sealing resin.
Figure 4:
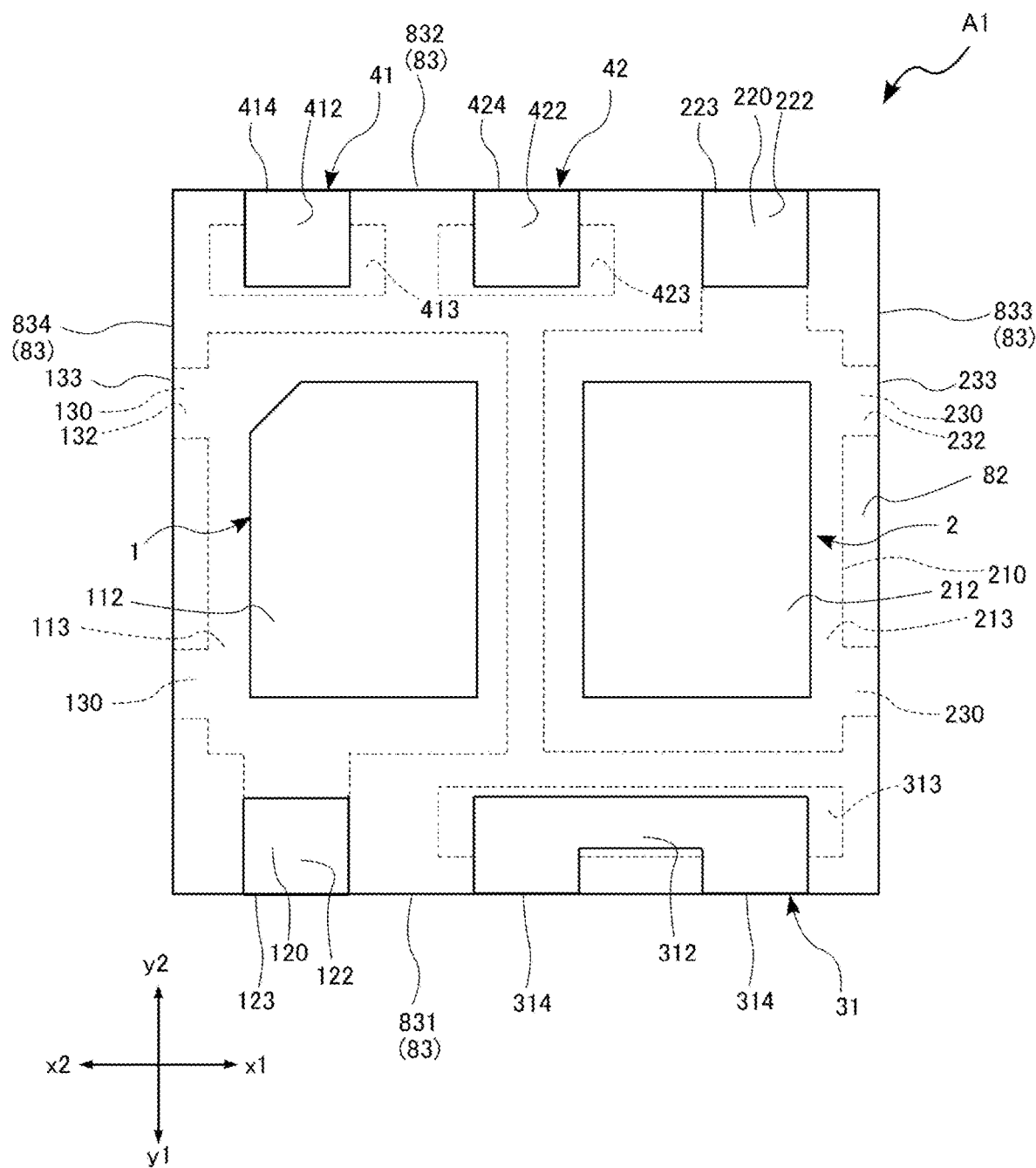
FIG. 4 is a bottom view showing the semiconductor device of FIG. 1.
Figure 5:
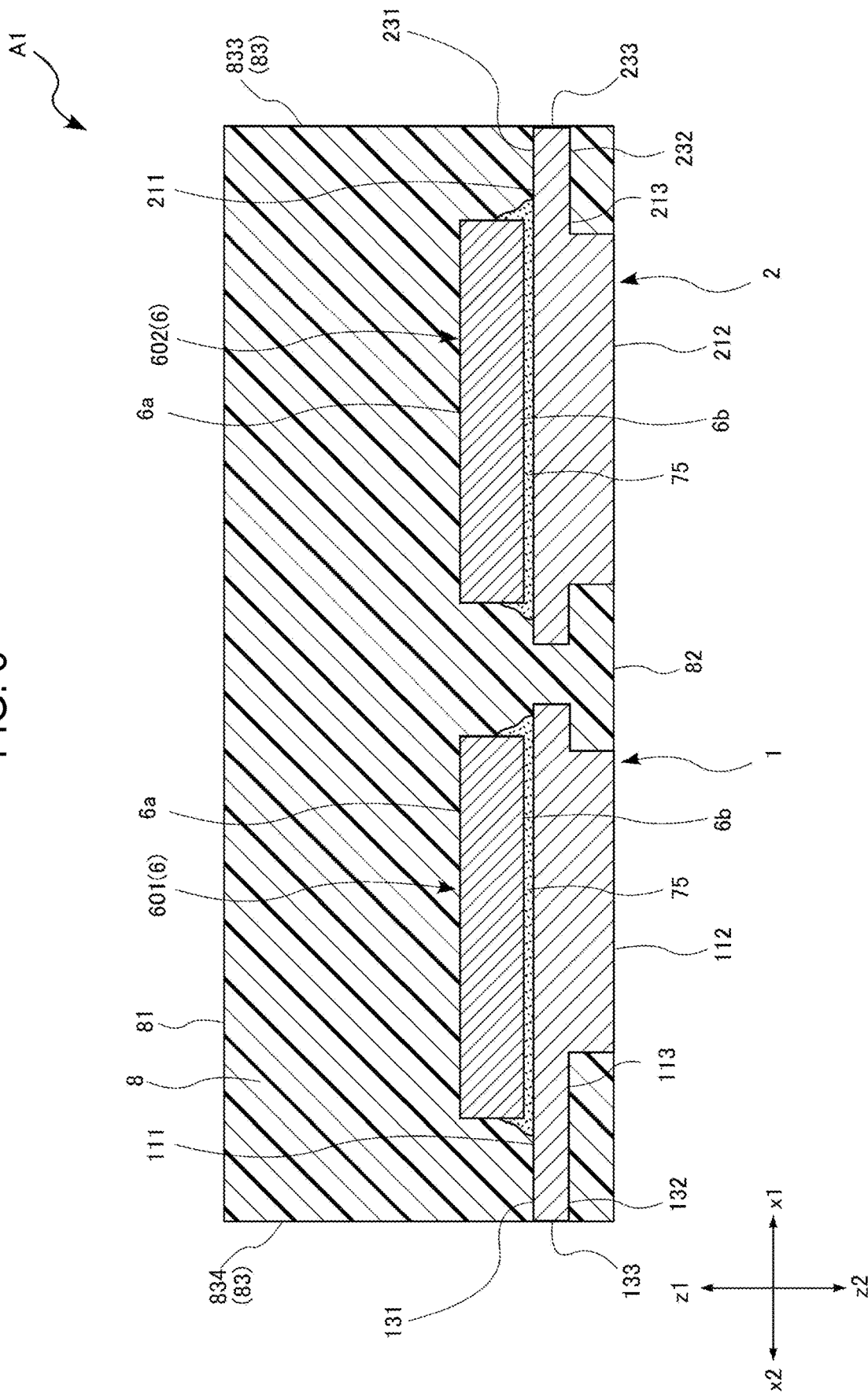
FIG. 5 is a cross-sectional view taken along line V-V of FIG. 3.
Figure 6:
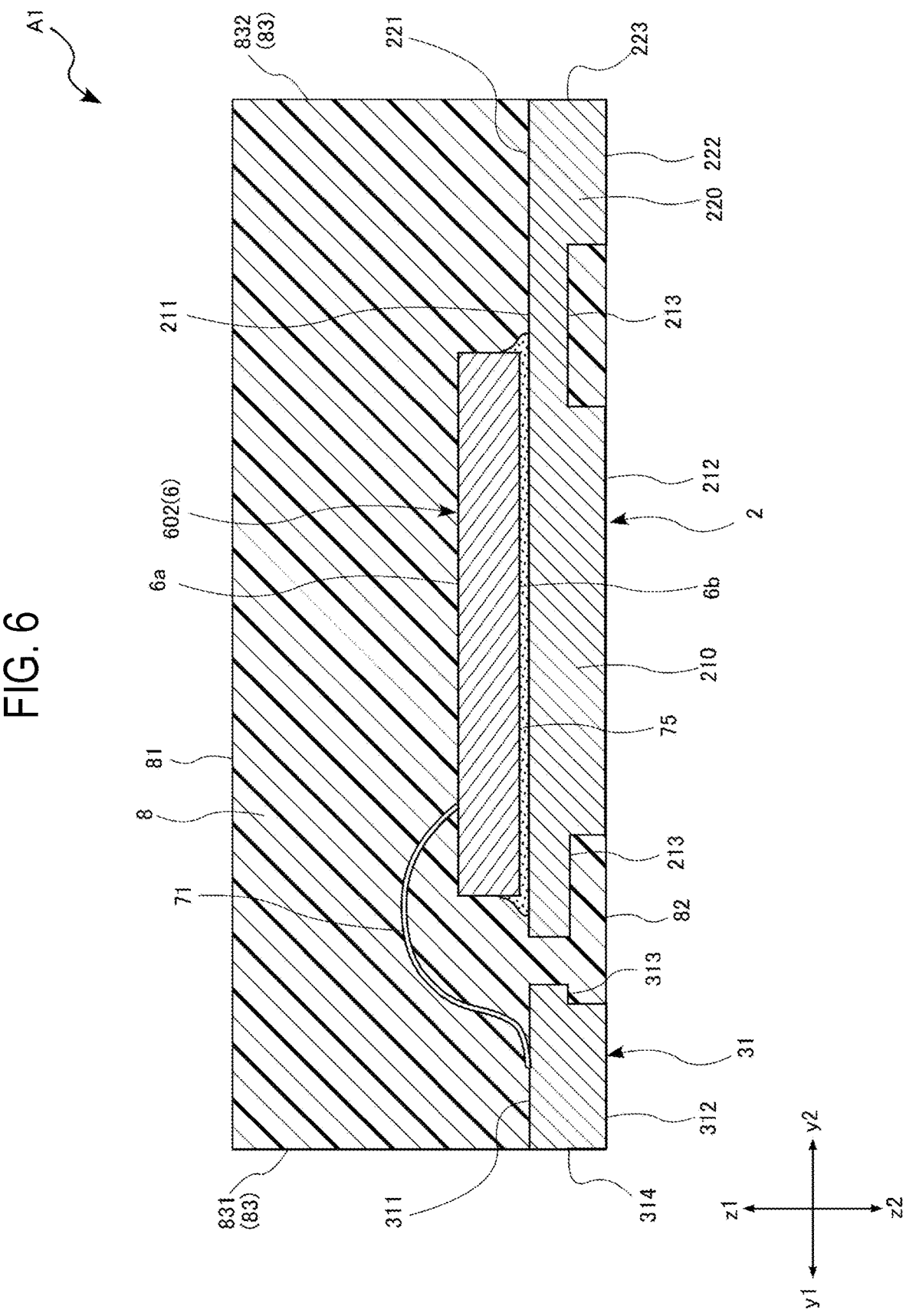
FIG. 6 is a cross-sectional view taken along line VI-VI of FIG. 3.
Figure 7:
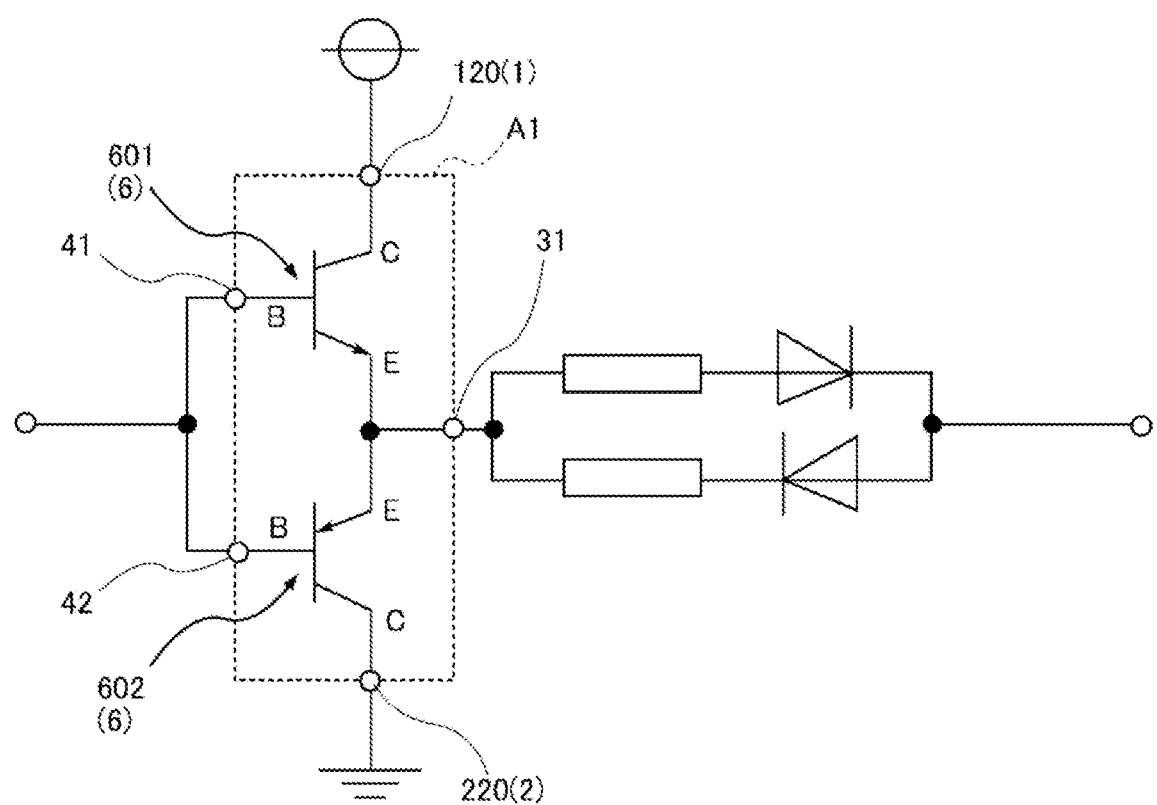
FIG. 7 is a circuit diagram showing the semiconductor device of FIG. 1.
Figure 8:
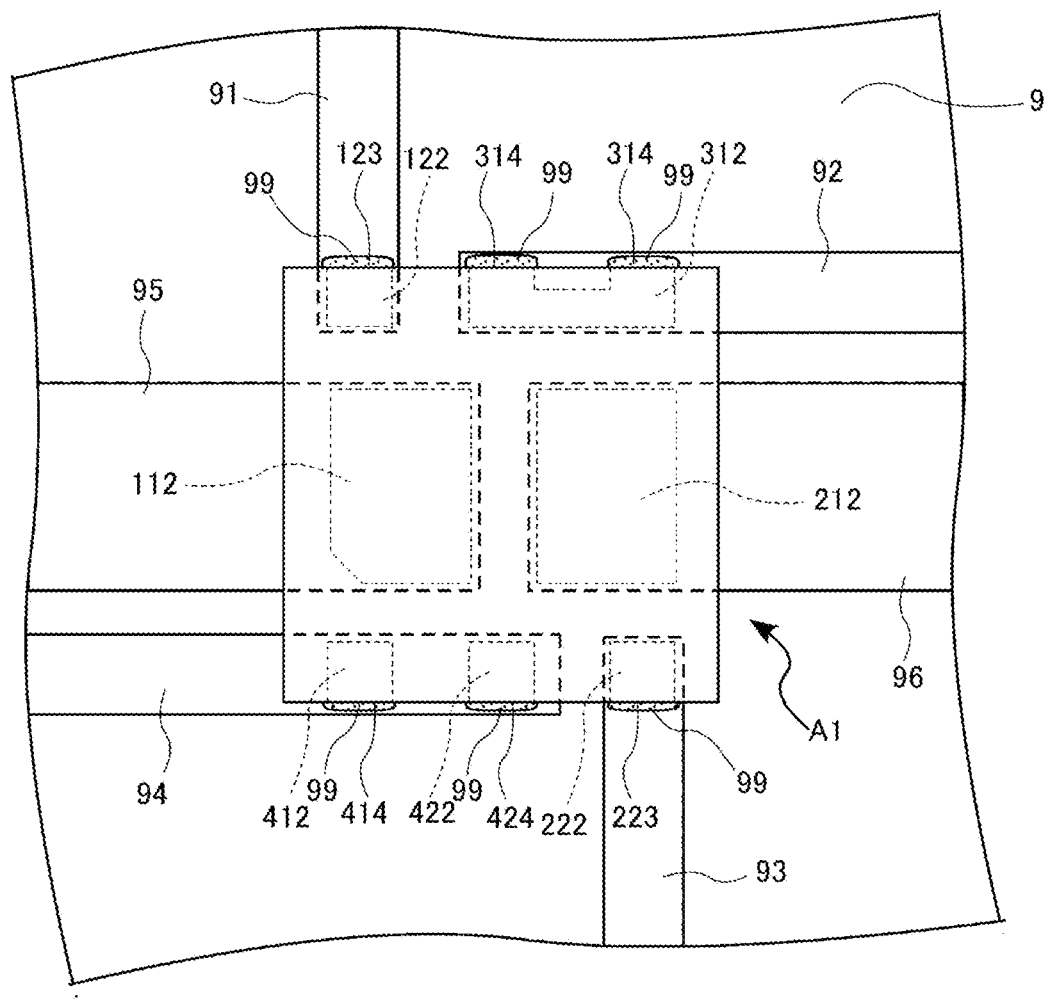
FIG. 8 is a diagram showing a mounting state of the semiconductor device of FIG. 1 on a wiring board.
Figure 8:
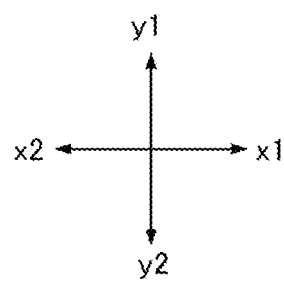

FIG. 1 is a perspective view showing the semiconductor device A1. FIG. 2 is a perspective view showing the semiconductor device A1, with the bottom side facing up. FIG. 3 is a plan view showing the semiconductor device A1. In FIG. 3, for convenience of understanding, the sealing resin 8 is transparent and an outer shape of the sealing resin 8 is shown by an imaginary line (two-dot chain line). FIG. 4 is a bottom view showing the semiconductor device A1. FIG. 5 is a cross-sectional view taken along line V-V of FIG. 3. FIG. 6 is a cross-sectional view taken along line VI-VI of FIG. 3. FIG. 7 is a circuit diagram showing the semiconductor device A1. FIG. 8 is a diagram showing a mounting state of the semiconductor device A1 on a wiring board.

The semiconductor device A1 has a rectangular shape when viewed in a thickness direction (in a plan view). For convenience of explanation, the thickness direction (a plan view direction) of the semiconductor device A1 is defined as a z direction, a direction (a horizontal direction in FIG. 3), which extends along one side of the semiconductor device A1 and is orthogonal to the z direction, is defined as an x direction, and a direction (a vertical direction in FIG. 3) orthogonal to both of the z direction and the x direction is defined as a y direction. Further, one side (an upper side in FIGS. 5 and 6) in the z direction is defined as a z1 side, and the other side (a lower side in FIGS. 5 and 6) is defined as a z2 side. One side (a right-hand side in FIGS. 3 and 4) in the x direction is defined as an x1 side, and the other side (a left-hand side in FIGS. 3 and 4) is defined as an x2 side. One side (an upper side in FIG. 3) in the y direction is defined as a y1 side, and the other side (a lower side in FIG. 3) is defined as a y2 side. The z direction corresponds to the "thickness direction" of the present disclosure, the y direction corresponds to a "first direction" of the present disclosure, and the x direction corresponds to a "second direction" of the present disclosure. In the present embodiment, as a size of the semiconductor device A1, for example, a dimension in the x direction is 1 mm or more and 3 mm or less, a dimension in the y direction is 1 mm or more and 3 mm or less, and a dimension in the z direction is 0.3 mm or more and 1 mm or less. The dimensions of the semiconductor device A1 are not particularly limited.

The leads 1, 2, 31, 41, and 42 are electrically connected to the semiconductor elements 6. The leads 1, 2, 3 1, 41, and 42 are formed, for example, by subjecting a metal plate to an etching process, a punching process, or the like. The leads 1, 2, 31, 41, and 42 are formed of metal, specifically one of Cu and Ni, or an alloy thereof, 42 alloy, or the like. In the present embodiment, a case where the leads 1, 2, 31, 41, and 42 are formed of Cu will be described as an example. A thickness of the leads 1, 2, 31, 41, and 42 is, for example, 0.08 to 0.3 mm, and in the present embodiment, it is about 0.2 mm. In the following description, the leads 1, 2, 31, 41, and 42 refer to a first lead 1, a second lead 2, a third lead 31, a fifth lead 41, and a sixth lead 42, respectively, which are collectively described as the leads 1, 2, 31, 41, and 42.

As shown in FIG. 3, the first lead 1 is entirely disposed on the x2 side of a center of the semiconductor device A1 in the x direction and is located biased to the y1 side in the y direction. The second lead 2 is entirely disposed on the x1 side of the center of the semiconductor device A1 in the x direction and is located biased to the y2 side in the y direction. The third lead 31 is disposed at an end portion of the semiconductor device A1 on the y1 side in the y direction and is located biased to the x1 side in the x direction. The third lead 31 is disposed on the y1 side of the first lead 1 and the second lead 2 in the y direction and is separated from the first lead 1 and the second lead 2. The fifth lead 41 is disposed at an end portion of the semiconductor device A1 on the x2 side in the x direction and the y2 side in the y direction, and is separated from the first lead 1 and the second lead 2. The sixth lead 42 is disposed at an end portion of the semiconductor device A1 on the y2 side in the y direction and between the second lead 2 and the fifth lead 41 in the x direction, and is separated from the first lead 1, the second lead 2, and the fifth lead 41. That is, the fifth lead 41 and the sixth lead 42 are arranged on the side opposite to the third lead 31 with respect to the first lead 1 and the second lead 2 in the y direction. Further, the fifth lead 41 and the sixth lead 42 are arranged adjacent to each other in the x direction. As for the dimensions viewed in the z direction, the first lead 1 and the second lead 2 are large, and the fifth lead 41 and the sixth lead 42 are small.

The first lead 1 supports the semiconductor element 6 (the semiconductor element 601) and includes a die pad portion 110, a terminal portion 120, and a plurality of connecting portions 130.

When viewed in the z direction, the die pad portion 110 is entirely disposed on the x2 side of the center of the semiconductor device A1 in the x direction, and is located in a center portion in the y direction. The die pad portion 110 has substantially a rectangular shape when viewed in the z direction. The die pad portion 110 has a die pad portion main surface 111, a die pad portion back surface 112, and a die pad portion back surface side recess 113. The die pad portion main surface 111 and the die pad portion back surface 112 face opposite to each other in the z direction. The die pad portion main surface 111 faces the z1 side in the z direction. The die pad portion main surface 111 is a surface on which the semiconductor element 601 is mounted. The die pad portion back surface 112 faces the z2 side in the z direction. The die pad portion back surface 112 is exposed from the sealing resin 8 and serves as a back surface terminal.

The die pad portion back surface side recess 113 is a portion in which a portion of the die pad portion 110 is recessed from the die pad portion back surface 112 to the die pad portion main surface 111. A thickness (a dimension in the z direction) of a portion of the die pad portion 110 where the die pad portion back surface side recess 113 is located is about half the thickness of a portion where the die pad portion back surface 112 is located. The die pad portion back surface side recess 113 is formed by, for example, a half etching process. As shown in FIG. 4, the die pad portion back surface side recess 113 is disposed around the die pad portion back surface 112. As shown in FIG. 4, the die pad portion back surface side recess 113 is not exposed from the sealing resin 8 and is covered with the sealing resin 8. As a result, the first lead 1 is prevented from peeling from the sealing resin 8 on the z2 side in the z direction. A shape of the die pad portion 110 is not particularly limited. For example, the die pad portion 110 may not include the die pad portion back surface side recess 113.

The terminal portion 120 is connected to the die pad portion 110 and has substantially a rectangular shape when viewed in the z direction. In the present embodiment, the terminal portion 120 is disposed on the y1 side of the die pad portion 110 in the y direction and is located biased to the x2 side in the x direction. The terminal portion 120 has a terminal portion main surface 121, a terminal portion back surface 122, and a terminal portion end surface 123. The terminal portion main surface 121 and the terminal portion back surface 122 face opposite to each other in the z direction. The terminal portion main surface 121 faces the z1 side in the z direction. The terminal portion main surface 121 and the die pad portion main surface 111 are flush with each other. The terminal portion back surface 122 faces the z2 side in the z direction. The terminal portion back surface 122 and the die pad portion back surface 112 are separated from each other in the y direction, and positions thereof in the z direction are the same as each other. The terminal portion end surface 123 is a surface orthogonal to the terminal portion main surface 121 and the terminal portion back surface 122, and is connected to the terminal portion main surface 121 and the terminal portion back surface 122. The terminal portion end surface 123 is a surface facing the y1 side in the y direction. The terminal portion end surface 123 is formed by dicing in a cutting step in a manufacturing process. The terminal portion end surface 123 and the terminal portion back surface 122 are connected to each other while being exposed from the sealing resin 8, thereby forming a terminal (see FIG. 4). The shape, arrangement position, and number of terminal portions 120 are not particularly limited.

Each of the plurality of connecting portions 130 is connected to the die pad portion 110 and has substantially a rectangular shape when viewed in the z direction. In the present embodiment, two connecting portions 130 are arranged side by side in the y direction on the x2 side of the die pad portion 110 in the x direction. A thickness (a dimension in the z direction) of each connecting portion 130 is about the same as the thickness of the die pad portion 110 in which the die pad portion back surface side recess 113 is located. The connecting portions 130 are formed by, for example, a half etching process. Each connecting portion 130 has a connecting portion main surface 131, a connecting portion back surface 132, and a connecting portion end surface 133. The connecting portion main surface 131 and the connecting portion back surface 132 face opposite to each other in the z direction. The connecting portion main surface 131 faces the z1 side in the z direction. The connecting portion main surface 131 and the die pad portion main surface 111 are flush with each other. Therefore, the die pad portion main surface 111, the terminal portion main surface 121, and the connecting portion main surface 131 are flush with one another (see FIG. 3). The connecting portion back surface 132 faces the z2 side in the z direction. The connecting portion back surface 132 and the die pad portion back surface side recess 113 are flush with each other. The connecting portion end surface 133 is a surface that connects the connecting portion main surface 131 and the connecting portion back surface 132, and is a surface that faces the x2 side in the z direction. The connecting portion end surface 133 is formed by dicing in a cutting step in a manufacturing process. The connecting portion end surface 133 is exposed from the sealing resin 8. The shape, arrangement position, and number of connecting portions 130 are not particularly limited.

The second lead 2 supports the semiconductor element 6 (the semiconductor element 602) and includes a die pad portion 210, a terminal portion 220, and a plurality of connecting portions 230.

When viewed in the z direction, the die pad portion 210 is entirely disposed on the x1 side of the center of the semiconductor device A1 in the x direction, and is located in the center portion in the y direction. The die pad portion 210 has substantially a rectangular shape when viewed in the z direction. The die pad portion 210 has a die pad portion main surface 211, a die pad portion back surface 212, and a die pad portion back surface side recess 213. The die pad portion main surface 211 and the die pad portion back surface 212 face opposite to each other in the z direction. The die pad portion main surface 211 faces the z1 side in the z direction. The die pad portion main surface 211 is a surface on which the semiconductor element 602 is mounted. The die pad portion back surface 212 faces the z2 side in the z direction. The die pad portion back surface 212 is exposed from the sealing resin 8 and serves as a back surface terminal.

The die pad portion back surface side recess 213 is a portion in which a portion of the die pad portion 210 is recessed from the die pad portion back surface 212 to the die pad portion main surface 211. A thickness (a dimension in the z direction) of a portion of the die pad portion 210 where the die pad portion back surface side recess 213 is located is about half the thickness of a portion where the die pad portion back surface 212 is located. The die pad portion back surface side recess 213 is formed by, for example, a half etching process. As shown in FIG. 4, the die pad portion back surface side recess 213 is disposed around the die pad portion back surface 212. As shown in FIGS. 4 and 6, the die pad portion back surface side recess 213 is not exposed from the sealing resin 8 and is covered with the sealing resin 8. As a result, the second lead 2 is prevented from peeling from the sealing resin 8 on the z2 side in the z direction. The shape of the die pad portion 210 is not particularly limited. For example, the die pad portion 210 may not include the die pad portion back surface side recess 213.

The terminal portion 220 is connected to the die pad portion 210 and has substantially a rectangular shape when viewed in the z direction. In the present embodiment, the terminal portion 220 is disposed on the y2 side of the die pad portion 210 in the y direction and is located biased to the x1 side in the x direction. The terminal portion 220 has a terminal portion main surface 221, a terminal portion back surface 222, and a terminal portion end surface 223. The terminal portion main surface 221 and the terminal portion back surface 222 face opposite to each other in the z direction. The terminal portion main surface 221 faces the z1 side in the z direction. The terminal portion main surface 221 and the die pad portion main surface 211 are flush with each other. The terminal portion back surface 222 faces the z2 side in the z direction. The terminal portion back surface 222 and the die pad portion back surface 212 are separated from each other in the y direction, and positions thereof in the z direction are the same as each other. The terminal portion end surface 223 is a surface orthogonal to the terminal portion main surface 221 and the terminal portion back surface 222, and is connected to the terminal portion main surface 221 and the terminal portion back surface 222. The terminal portion end surface 223 is a surface facing the y2 side in the y direction. The terminal portion end surface 223 is formed by dicing in a cutting step in a manufacturing process. The terminal portion end surface 223 and the terminal portion back surface 222 are connected to each other while being exposed from the sealing resin 8, thereby forming a terminal (see FIGS. 2, 4, and 6). The shape, arrangement position, and number of terminal portions 220 are not particularly limited.

Each of the plurality of connecting portions 230 is connected to the die pad portion 210 and has substantially a rectangular shape when viewed in the z direction. In the present embodiment, two connecting portions 230 are arranged side by side in the y direction on the x1 side of the die pad portion 210 in the x direction. A thickness (a dimension in the z direction) of each connecting portion 230 is about the same as the thickness of the die pad portion 210 in which the die pad portion back surface side recess 213 is located. The connecting portions 230 are formed by, for example, a half etching process. Each connecting portion 230 has a connecting portion main surface 231, a connecting portion back surface 232, and a connecting portion end surface 233. The connecting portion main surface 231 and the connecting portion back surface 232 face opposite to each other in the z direction. The connecting portion main surface 231 faces the z1 side in the z direction. The connecting portion main surface 231 and the die pad portion main surface 211 are flush with each other. Therefore, the die pad portion main surface 211, the terminal portion main surface 221, and the connecting portion main surface 231 are flush with one another (see FIG. 3). The connecting portion back surface 232 faces the z2 side in the z direction. The connecting portion back surface 232 and the die pad portion back surface side recess 213 are flush with each other. The connecting portion end surface 233 is a surface that connects the connecting portion main surface 231 and the connecting portion back surface 232, and is a surface that faces the x1 side in the x direction. The connecting portion end surface 233 is formed by dicing in a cutting step in a manufacturing process. The connecting portion end surface 233 is exposed from the sealing resin 8. The shape, arrangement position, and number of connecting portions 230 are not particularly limited.

When viewed in the z direction, the third lead 31 is disposed at a corner portion (an upper right corner portion in FIG. 3) of the semiconductor device A1 on the y1 side in the y direction and the x1 side in the x direction. The third lead 31 has a main surface 311, a back surface 312, a back surface side recess 313, and an end surface 314.

The main surface 311 and the back surface 312 face opposite to each other in the z direction. The main surface 311 faces the z1 side in the z direction. The main surface 311 is a surface to which the wire 71 is bonded. In the present embodiment, the main surface 311 has a shape having two portions protruding toward the y1 side in the y direction from a rectangle which is long in the x direction. The two protruding portions are arranged side by side in the x direction, and both of the two protruding portions reach an edge of the semiconductor device A1 on the y1 side in the y direction. The back surface 312 faces the z direction on the z2 side. The back surface 312 is exposed from the sealing resin 8 and serves as a back surface terminal. In the present embodiment, a shape of the back surface 312 is a U-shape that is opened on the y1 side in the y direction. Each end portion of the U-shape reaches the edge of the semiconductor device A1 on the y1 side in the y direction.

The back surface side recess 313 is a portion in which a portion of the third lead 31 is recessed from the back surface 312 to the main surface 311. A thickness (a dimension in the z direction) of a portion of the third lead 31 where the back surface side recess 313 is located is about half the thickness of a portion where the back surface 312 is located. The back surface side recess 313 is formed by, for example, a half etching process. As shown in FIG. 4, the back surface side recess 313 is not exposed from the sealing resin 8 and is covered with the sealing resin 8. As a result, the third lead 31 is prevented from peeling from the sealing resin 8 on the z2 side in the z direction.

The end surface 314 is a surface orthogonal to the main surface 311 and the back surface 312, and is connected to the main surface 311 and the back surface 312. The end surface 314 is a surface facing the y1 side in the y direction. The end surface 314 is formed by dicing in a cutting process in a manufacturing process. In the present embodiment, the end surface 314 is composed of two portions separated by the sealing resin 8. The end surface 314 and the back surface 312 are connected to each other while being exposed from the sealing resin 8, thereby forming a terminal (see FIGS. 2, 4, and 6). The shape of the third lead 31 is not particularly limited. For example, the back surface side recess 313 may not be provided. In the present embodiment, the third lead 31 corresponds to a "first terminal" and a "second terminal" of the present disclosure. That is, in the present embodiment, the third lead 31 also serves as the "first terminal" and the "second terminal" of the present disclosure.

When viewed in the z direction, the fifth lead 41 is disposed at a corner portion (a lower left corner portion in FIG. 3) of the semiconductor device A1 on the y2 side in the y direction and the x2 side in the x direction. The fifth lead 41 has substantially a rectangular shape when viewed in the z direction, and has a main surface 411, a back surface 412, a back surface side recess 413, and an end surface 414.

The main surface 411 and the back surface 412 face opposite to each other in the z direction. The main surface 411 faces the z1 side in the z direction. The main surface 411 is a surface to which the wire 72 is bonded. The back surface 412 faces the z2 side in the z direction. The back surface 412 is exposed from the sealing resin 8 and serves as a back surface terminal.

The back surface side recess 413 is a portion in which a portion of the fifth lead 41 is recessed from the back surface 412 to the main surface 411. A thickness (a dimension in the z direction) of a portion of the fifth lead 41 where the back surface side recess 413 is located is about half the thickness of a portion where the back surface 412 is located. The back surface side recess 413 is formed by, for example, a half etching process. As shown in FIG. 4, the back surface side recess 413 is not exposed from the sealing resin 8 and is covered with the sealing resin 8. As a result, the fifth lead 41 is prevented from peeling from the sealing resin 8 on the z2 side in the z direction.

The end surface 414 is a surface orthogonal to the main surface 411 and the back surface 412, and is connected to the main surface 411 and the back surface 412. The end surface 414 is a surface facing the y2 side in the y direction. The end surface 414 is formed by dicing in a cutting process in a manufacturing process. The end surface 414 and the back surface 412 are connected to each other while being exposed from the sealing resin 8, thereby forming a terminal (see FIGS. 2 and 4). The shape of the fifth lead 41 is not particularly limited. For example, the back surface side recess 413 may not be provided. In the present embodiment, the fifth lead 41 corresponds to the "third terminal" of the present disclosure.

When viewed in the z direction, the sixth lead 42 is disposed at an end portion of the semiconductor device A1 on the y2 side in the y direction and is located between the fifth lead 41 and the terminal portion 220 of the second lead 2 in the x direction. The sixth lead 42 is separated from the fifth lead 41 and the second lead 2, and is insulated from the fifth lead 41 and the second lead 2 in the semiconductor device A1. The sixth lead 42 has substantially a rectangular shape when viewed in the z direction and has a main surface 421, a back surface 422, a back surface side recess 423, and an end surface 424.

The main surface 421 and the back surface 422 face opposite to each other in the z direction. The main surface 421 faces the z1 side in the z direction. The main surface 421 is a surface to which the wire 72 is bonded. The back surface 422 faces the z2 side in the z direction. The back surface 422 is exposed from the sealing resin 8 and serves as a back surface terminal.

The back surface side recess 423 is a portion in which a portion of the sixth lead 42 is recessed from the back surface 422 to the main surface 421. A thickness (a dimension in the z direction) of a portion of the sixth lead 42 where the back surface side recess 423 is located is about half the thickness of a portion where the back surface 422 is located. The back surface side recess 423 is formed by, for example, a half etching process. As shown in FIG. 4, the back surface side recess 423 is not exposed from the sealing resin 8 and is covered with the sealing resin 8. As a result, the sixth lead 42 is prevented from peeling from the sealing resin 8 on the z2 side in the z direction.

The end surface 424 is a surface orthogonal to the main surface 421 and the back surface 422, and is connected to the main surface 421 and the back surface 422. The end surface 424 is a surface facing the y2 side in the y direction. The end surface 424 is formed by dicing in a cutting process in a manufacturing process. The end surface 424 and the back surface 422 are connected to each other while being exposed from the sealing resin 8, thereby forming a terminal (see FIGS. 2 and 4). The shape of the sixth lead 42 is not particularly limited. For example, the back surface side recess 423 may not be provided. In the present embodiment, the sixth lead 42 corresponds to a "fourth terminal" of the present disclosure.

Further, a plating layer may be formed on surfaces of the leads 1, 2, 31, 41, and 42. The plating layer may be a stack of a Ni plating layer, a Pd plating layer, and an Au plating layer for facilitating bonding of the wires 71 and 72, or may be formed of an alloy or the like containing Sn as a main component for improving solder wettability.

The two semiconductor elements 6 are elements that exhibit electrical functions of the semiconductor device A1. Each semiconductor element 6 is a switching element. In this embodiment, the semiconductor element 6 is a bipolar transistor. The semiconductor element 6 may be an IGBT, a MOSFET, a HEMT (High Electron Mobility Transistor), or the like. The two semiconductor elements 6 include the semiconductor element 601 and the semiconductor element 602. In the present embodiment, the semiconductor element 601 is of an NPN type, and the semiconductor element 602 is of a PNP type. When described without distinction from each other, the semiconductor elements 601 and 602 are described as the semiconductor element 6. Each semiconductor element 6 includes an element body 60, a first electrode 61, a second electrode 62, and a third electrode 63.

The element body 60 has a rectangular plate shape when viewed in the z direction. The element body 60 is formed of a semiconductor material. In this embodiment, the element body 60 is formed of Si (silicon). The material of the element body 60 is not particularly limited, but may be other materials such as SiC (silicon carbide) and GaN (gallium nitride). The element body 60 has an element main surface 6a and an element back surface 6b. The element main surface 6a and the element back surface 6b face opposite to each other in the z direction. The element main surface 6a faces the z1 side in the z direction. The element back surface 6b faces the z2 side in the z direction. The first electrode 61 and the second electrode 62 are disposed on the element main surface 6a. The third electrode 63 is disposed on the element back surface 6b. In the present embodiment, the first electrode 61 is an emitter electrode, the second electrode 62 is a base electrode, and the third electrode 63 is a collector electrode.

As shown in FIG. 5, the semiconductor element 601 is mounted on the center of the die pad portion main surface 111 of the first lead 1 via a bonding material 75. In the present embodiment, the bonding material 75 is a conductive bonding material, for example, solder. The bonding material 75 may be a conductive bonding material such as a silver paste or a sintered silver bonding material. In the semiconductor element 601, the element back surface 6b is bonded to the die pad portion main surface 111 of the first lead 1 by the bonding material 75. The third electrode 63 of the semiconductor element 601 is electrically connected to the first lead 1 via the bonding material 75. As a result, the first lead 1 is electrically connected to the third electrode 63 (the collector electrode) of the semiconductor element 601 and functions as a collector terminal of the semiconductor element 601. As shown in FIG. 3, the second electrode 62 of the semiconductor element 601 is electrically connected to the fifth lead 41 via the wire 72. As a result, the fifth lead 41 is electrically connected to the second electrode 62 (the base electrode) of the semiconductor element 601 and functions as a base terminal of the semiconductor element 601.

As shown in FIGS. 5 and 6, the semiconductor element 602 is mounted on the center of the die pad portion main surface 211 of the second lead 2 via the bonding material 75. In the semiconductor element 602, the element back surface 6b is bonded to the die pad portion main surface 211 of the second lead 2 by the bonding material 75. The third electrode 63 of the semiconductor element 602 is electrically connected to the second lead 2 via the bonding material 75. As a result, the second lead 2 is electrically connected to the third electrode 63 (the collector electrode) of the semiconductor element 602 and functions as a collector terminal of the semiconductor element 602. As shown in FIG. 3, the second electrode 62 of the semiconductor element 602 is electrically connected to the sixth lead 42 via the wire 72. As a result, the sixth lead 42 is conductively connected to the second electrode 62 (the base electrode) of the semiconductor element 602 and functions as a base terminal of the semiconductor element 602.

Further, as shown in FIG. 3, the first electrode 61 of the semiconductor element 601 and the first electrode 61 of the semiconductor element 602 are electrically connected to the third lead 31 via the wires 71, respectively. As a result, the third lead 31 is conductively connected to the first electrode 61 (the emitter electrode) of the semiconductor element 601 and the first electrode 61 (the emitter electrode) of the semiconductor element 602 and functions as a common emitter terminal of the semiconductor element 601 and the semiconductor element 602.

The wires 71 and 72 are provided to electrically connect the semiconductor element 6 to the third lead 31, the fifth lead 41, or the sixth lead 42. The wires 71 and 72 are formed of, for example, a metal such as Cu, Au, Ag, or Al. The materials of the wires 71 and 72 are not particularly limited. As shown in FIG. 3, the wire 71 is connected to the first electrode 61 of the semiconductor element 601 and the main surface 311 of the third lead 31. In the present embodiment, the first electrode 61 of the semiconductor element 601 is connected to the main surface 311 by one wire 71, but may be connected by a plurality of wires 71. The other wire 71 is connected to the first electrode 61 of the semiconductor element 602 and the main surface 311 of the third lead 31. In the present embodiment, the first electrode 61 of the semiconductor element 602 is connected to the main surface 311 by one wire 71, but may be connected by a plurality of wires 71. The wire 72 is connected to the second electrode 62 of the semiconductor element 601 and the main surface 411 of the fifth lead 41. In the present embodiment, the second electrode 62 of the semiconductor element 601 is connected to the main surface 411 by one wire 72, but may be connected by a plurality of wires 72. The other wire 72 is connected to the second electrode 62 of the semiconductor element 602 and the main surface 421 of the sixth lead 42. In the present embodiment, the second electrode 62 of the semiconductor element 602 is connected to the main surface 421 by one wire 72, but may be connected by a plurality of wires 72. A metal plate such as Cu may be used instead of the wires 71 and 72.

The sealing resin 8 covers a portion of each of the leads 1, 2, 31, 41, and 42, each of the semiconductor elements 6, the bonding material 75, and each of the wires 71 and 72. The sealing resin 8 is formed of, for example, a black epoxy resin. The material of the sealing resin 8 is not particularly limited.

The sealing resin 8 has a resin main surface 81, a resin back surface 82, and four resin side surfaces 83. The resin main surface 81 and the resin back surface 82 face opposite to each other in the z direction. The resin main surface 81 is a surface facing the z1 side in the z direction, and the resin back surface 82 is a surface facing the z2 side in the z direction.

Each of the four resin side surfaces 83 is a surface that is orthogonal to the resin main surface 81 and the resin back surface 82 and connects the resin main surface 81 and the resin back surface 82, and is a surface facing outward in the x direction or the y direction. Each resin side surface 83 is formed by dicing in a cutting process in a manufacturing process. The four resin side surfaces 83 include a first resin side surface 831, a second resin side surface 832, a third resin side surface 833, and a fourth resin side surface 834. The first resin side surface 831 and the second resin side surface 832 face opposite to each other in the y direction. The first resin side surface 831 is a surface disposed on the y1 side in the y direction and facing the y1 side in the y direction, and the second resin side surface 832 is a surface disposed on the y2 side in the y direction and facing the y2 side in the y direction. The third resin side surface 833 and the fourth resin side surface 834 face opposite to each other in the x direction. The third resin side surface 833 is a surface disposed on the x1 side in the x direction and facing the x1 side in the x direction, and the fourth resin side surface 834 is a surface disposed on the x2 side in the x direction and facing the x2 side in the x direction.

The terminal portion end surface 123 of the first lead 1 and the end surface 314 of the third lead 31 are exposed from the first resin side surface 831 and are flush with the first resin side surface 831. The terminal portion end surface 223 of the second lead 2, the end surface 414 of the fifth lead 41, and the end surface 424 of the sixth lead 42 are exposed from the second resin side surface 832 and are flush with the second resin side surface 832. Each connecting portion end surface 133 of the first lead 1 is exposed from the fourth resin side surface 834 and is flush with the fourth resin side surface 834. Each connecting portion end surface 233 of the second lead 2 is exposed from the third resin side surface 833 and is flush with the third resin side surface 833. Further, the die pad portion back surface 112 and the terminal portion back surface 122 of the first lead 1 and the die pad portion back surface 212 and the terminal portion back surface 222 of the second lead 2 are exposed from the resin back surface 82 of the sealing resin 8 and are flush with the resin back surface 82. Further, the back surface 312 of the third lead 31, the back surface 412 of the fifth lead 41, and the back surface 422 of the sixth lead 42 are exposed from the resin back surface 82 of the sealing resin 8 and are flush with the resin back surface 82.

The semiconductor device A1 is used, for example, as a part of a buffer circuit of a gate driver circuit. As shown in FIG. 7, in the semiconductor device A1, the terminal portion 120 of the first lead 1 that functions as the collector terminal of the semiconductor element 601 is connected to a power supply, and the terminal portion 220 of the second lead 2 that functions as the collector terminal of the semiconductor element 602 is connected to the ground. In the semiconductor device A1, the fifth lead 41 that functions as the base terminal of the semiconductor element 601 and the sixth lead 42 that functions as the base terminal of the semiconductor element 602 are connected to a common wiring (a wiring 94 to be described later). The semiconductor device A1 receives a drive signal from a drive element (not shown) via the common wiring (the wiring 94). Then, the semiconductor device A1 outputs an amplified drive signal from the third lead 31 that functions as a common emitter terminal of the semiconductor element 601 and the semiconductor element 602, and inputs the amplified drive signal to a switching element (not shown) via a current limiting circuit.

In order to drive the switching element, the semiconductor device A1 is required to output a large amount of current of 10 A or more and 30 A or less from the third lead 31. However, the semiconductor device A1 outputs a pulsed current, and does not continue to output a constant current. Since a pulse width of a current output by the semiconductor device A1 is as short as several µs or less, the semiconductor device A1 outputs a large amount of current having the maximum current of 10 A or more and 30 A or less, but a loss due to such current is not big.

As shown in FIG. 8, the semiconductor device A1 is mounted on a wiring board 9. In the semiconductor device A1 shown in FIG. 8, for the sake of convenience of understanding, the surfaces of the leads 1, 2, 31, 41, and 42 exposed from the resin back surface 82 are indicated by broken lines. As shown in FIG. 8, the semiconductor device A1 is mounted on the wiring board 9, and the leads 1, 2, 31, 41, and 42 are bonded to wirings 91 to 96 formed on the wiring board 9 by solder portions 99. The terminal portion back surface 122 and the terminal portion end surface 123 of the first lead 1 are bonded to the wiring 91 via a solder portion 99. The terminal portion back surface 222 and the terminal portion end surface 223 of the second lead 2 are bonded to the wiring 93 via a solder portion 99. The back surface 312 and the end surface 314 of the third lead 31 are bonded to the wiring 92 via a solder portion 99. The back surface 412 and the end surface 414 of the fifth lead 41 and the back surface 422 and the end surface 424 of the sixth lead 42 are bonded to the wiring 94 via a solder portion 99. The die pad portion back surface 112 of the first lead 1 is bonded to the wiring 95 via a solder portion 99 (not shown). The die pad portion back surface 212 of the second lead 2 is bonded to the wiring 96 via a solder portion 99 (not shown).

Next, operative effects of the semiconductor device A1 will be described.

According to the present embodiment, the first electrode 61 of the semiconductor element 601 and the first electrode 61 of the semiconductor element 602 are electrically connected to the third lead 31 by the wires 71, respectively. Further, the second electrode 62 of the semiconductor element 601 is electrically connected to the fifth lead 41 by the wire 72. The second electrode 62 of the semiconductor element 602 is electrically connected to the sixth lead 42 by the wire 72. The fifth lead 41 and the sixth lead 42 are arranged adjacent to each other on the y2 side of the first lead 1 and the second lead 2 in the y direction. Therefore, as shown in FIG. 8, in the wiring board 9 on which the semiconductor device A1 is mounted, the wiring 92 connected to the third lead 31 and the wiring 94 connected to the fifth lead 41 and the sixth lead 42 become simple wirings.

Further, according to the present embodiment, the die pad portion 110 of the first lead 1 includes the die pad portion back surface 112 exposed from the resin back surface 82. Further, the die pad portion 210 of the second lead 2 includes the die pad portion back surface 212 exposed from the resin back surface 82. By bonding the die pad portion back surface 112 and the die pad portion back surface 212 to the wiring board 9, the first lead 1 and the second lead 2 can transfer and dissipate heat generated by the semiconductor element 6 to the wiring board 9.

Further, according to the present embodiment, the terminal portion 120 of the first lead 1 is disposed on the y1 side of the die pad portion 110 in the y direction and located biased to the x2 side in the x direction. Further, the terminal portion 220 of the second lead 2 is disposed on the y2 side of the die pad portion 210 in the y direction and located biased to the x1 side in the x direction. This contributes to miniaturizing the shape of the semiconductor device A1 when viewed in the z direction.

Further, according to the present embodiment, the die pad portion back surface 112 and the terminal portion back surface 122 of the first lead 1 are separated from each other, and the die pad portion back surface side recess 113 located therebetween is covered with the sealing resin 8. As a result, it is possible to further prevent the first lead 1 from peeling from the sealing resin 8 toward the z2 side in the z direction, as compared with a case where the die pad portion back surface 112 and the terminal portion back surface 122 are connected to each other. Further, the die pad portion back surface 212 and the terminal portion back surface 222 of the second lead 2 are separated from each other, and the die pad portion back surface side recess 213 located therebetween is covered with the sealing resin 8. As a result, it is possible to further prevent the second lead 2 from peeling from the sealing resin 8 to the z2 side in the z direction, as compared with a case where the die pad portion back surface 212 and the terminal portion back surface 222 are connected to each other.

Further, according to the present embodiment, the third lead 31 has a wide integrated main surface 311. Therefore, it is possible to bond a larger number of wires 71 to the third lead 31, as compared with a case where the main surface 311 is divided into a plurality of portions. Further, according to the present embodiment, the shape of the back surface 312 of the third lead 31 is a U-shape that is opened on the y1 side in the y direction. That is, the back surface side recess 313 is covered with the sealing resin 8 in the inner portion of the U-shape. As a result, it is possible to further prevent the third lead 31 from peeling from the sealing resin 8 toward the z2 side in the z direction, as compared with a case where the back surface 312 of the third lead 31 has a rectangular shape. Further, the third lead 31 has a wide integrated back surface 312. The wires 71 can be stably bonded to a region of the main surface 311 that overlaps the back surface 312 when viewed in the z direction. Therefore, in the third lead 31, a region where the wires 71 can be stably bonded is wider than in a case where the back surface 312 is divided into a plurality of portions to narrow a region of the main surface 311 overlapping the back surface 312.

Further, according to the present embodiment, the fifth lead 41 and the sixth lead 42 are separated and insulated from each other. Therefore, the semiconductor element 601 and semiconductor element 602 mounted on the semiconductor device A1 can be individually inspected.

Further, according to the present embodiment, in the semiconductor device A1, the terminal portion end surface 123, the terminal portion end surface 223, the end surface 314, the end surface 414, and the end surface 424 are exposed from the sealing resin 8. Therefore, as shown in FIG. 8, in a state where the semiconductor device A1 is mounted on the wiring board 9 by the solder portions 99, solder fillets of the solder portions 99 are formed on the terminal portion end surface 123, the terminal portion end surface 223, the end surface 314, the end surface 414, and the end surface 424. Therefore, the bonding state of each of the leads 1, 2, 31, 41, and 42 can be confirmed even from the appearance after the mounting.

FIGS. 9 to 17 show other embodiments of the present disclosure. In these figures, the same or similar elements as those in the above embodiment are denoted by the same reference numerals as those in the above embodiment.

Second Embodiment

Figure 9:
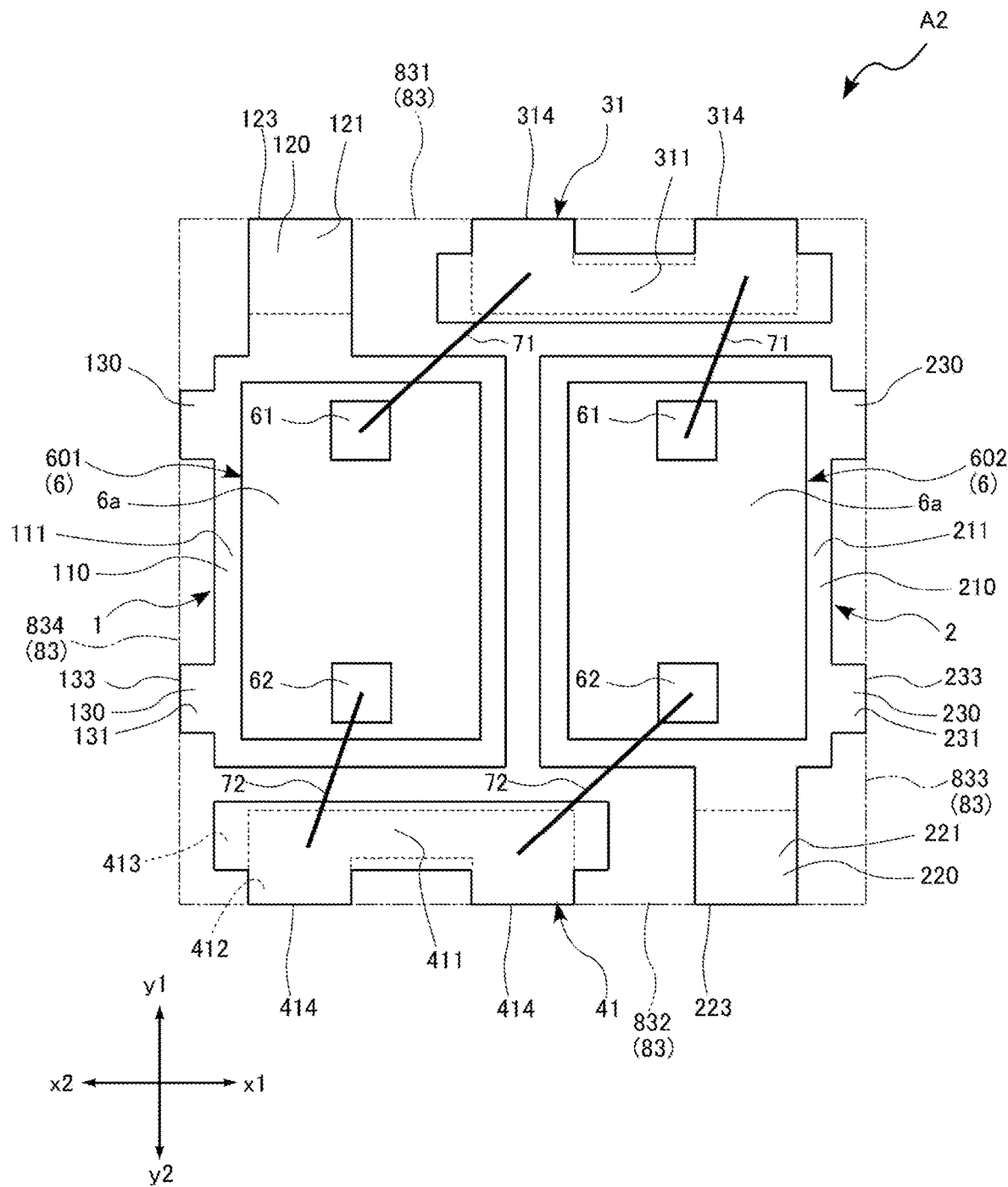
FIG. 9 is a plan view showing a semiconductor device according to a second embodiment of the present disclosure.

FIG. 9 is a plan view showing a semiconductor device A2 according to a second embodiment of the present disclosure. FIG. 9 corresponds to FIG. 3. In FIG. 9, for the sake of convenience of understanding, the sealing resin 8 is transparent and an outer shape of the sealing resin 8 is shown by an imaginary line (two-dot chain line). The semiconductor device A2 according to the second embodiment is different from the semiconductor device A1 according to the first embodiment in that the former does not include the sixth lead 42 and has a different shape of the fifth lead 41.

The semiconductor device A2 according to the second embodiment does not include the sixth lead 42. Further, the fifth lead 41 according to the second embodiment has a shape in which the fifth lead 41 and the sixth lead 42 according to the first embodiment are connected to each other, and has the same shape as the third lead 31. Further, in the second embodiment, the second electrode 62 of the semiconductor element 601 and the second electrode 62 of the semiconductor element 602 are electrically connected to the fifth lead 41 via the wires 72, respectively. As a result, the fifth lead 41 is electrically connected to the second electrode 62 (the base electrode) of the semiconductor element 601 and the second electrode 62 (the base electrode) of the semiconductor element 602 and functions as a common base terminal of the semiconductor element 601 and the semiconductor element 602. In the second embodiment, the fifth lead 41 corresponds to the "third terminal" and the "fourth terminal" of the present disclosure. That is, in the second embodiment, the fifth lead 41 also serves as the "third terminal" and the "fourth terminal" of the present disclosure.

According to the second embodiment, the first electrode 61 of the semiconductor element 601 and the first electrode 61 of the semiconductor element 602 are electrically connected to the third lead 31 by the wires 71, respectively. Further, the second electrode 62 of the semiconductor element 601 and the second electrode 62 of the semiconductor element 602 are electrically connected to the fifth lead 41 by the wires 72, respectively. Therefore, in the wiring board 9 on which the semiconductor device A2 is mounted, the wiring 92 connected to the third lead 31 and the wiring 94 connected to the fifth lead 41 become simple wirings.

Further, according to the second embodiment, the fifth lead 41 has a wide integrated main surface 411. Therefore, as in the first embodiment, it is possible to bond a larger number of wires 72 to the fifth lead 41 as compared with a case where the wires 72 are dividedly bonded to the main surface 411 of the fifth lead 41 and the main surface 421 of the sixth lead 42. Further, according to the second embodiment, the shape of the back surface 412 of the fifth lead 41 is a U-shape in which the y2 side in the y direction is open. That is, the back surface side recess 413 is covered with the sealing resin 8 in the inner portion of the U-shape. As a result, it is possible to further prevent the fifth lead 41 from peeling from the sealing resin 8 toward the z2 side in the z direction, as compared with a case where the back surface 412 of the fifth lead 41 has a rectangular shape. Further, the fifth lead 41 has a wide integrated back surface 412. The wires 72 can be stably bonded to a region of the main surface 411 that overlaps the back surface 412 when viewed in the z direction. Therefore, in the fifth lead 41, a region where the wires 72 can be stably bonded is wider than in a case where the back surface 412 is divided into a plurality of portions to narrow a region of the main surface 411 overlapping the back surface 412.

Further, the semiconductor device A2 has the same effects as the semiconductor device A1 by adopting the configurations common with the semiconductor device A1.

Third Embodiment

Figure 10:
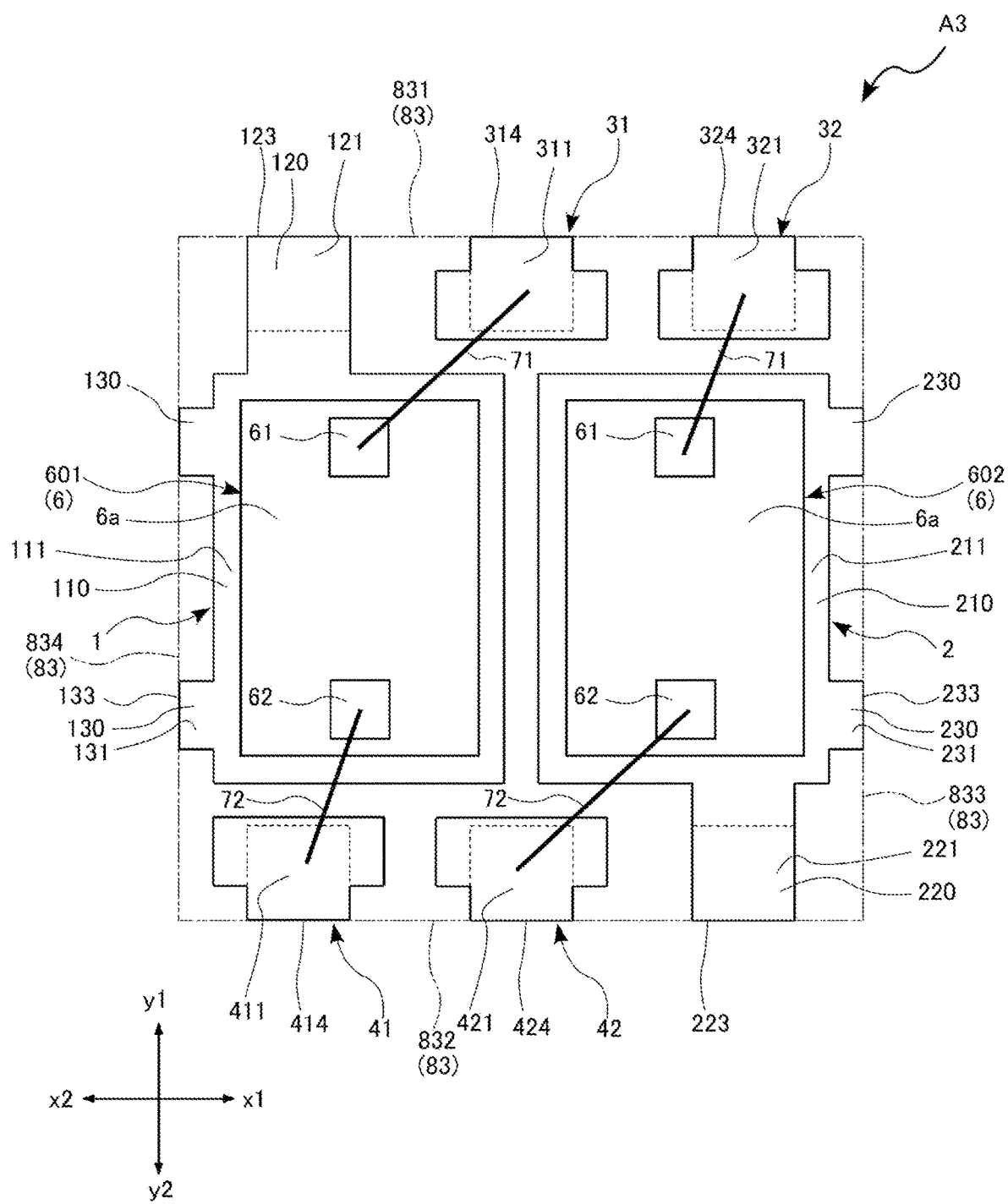
FIG. 10 is a plan view showing a semiconductor device according to a third embodiment of the present disclosure.
Figure 11:
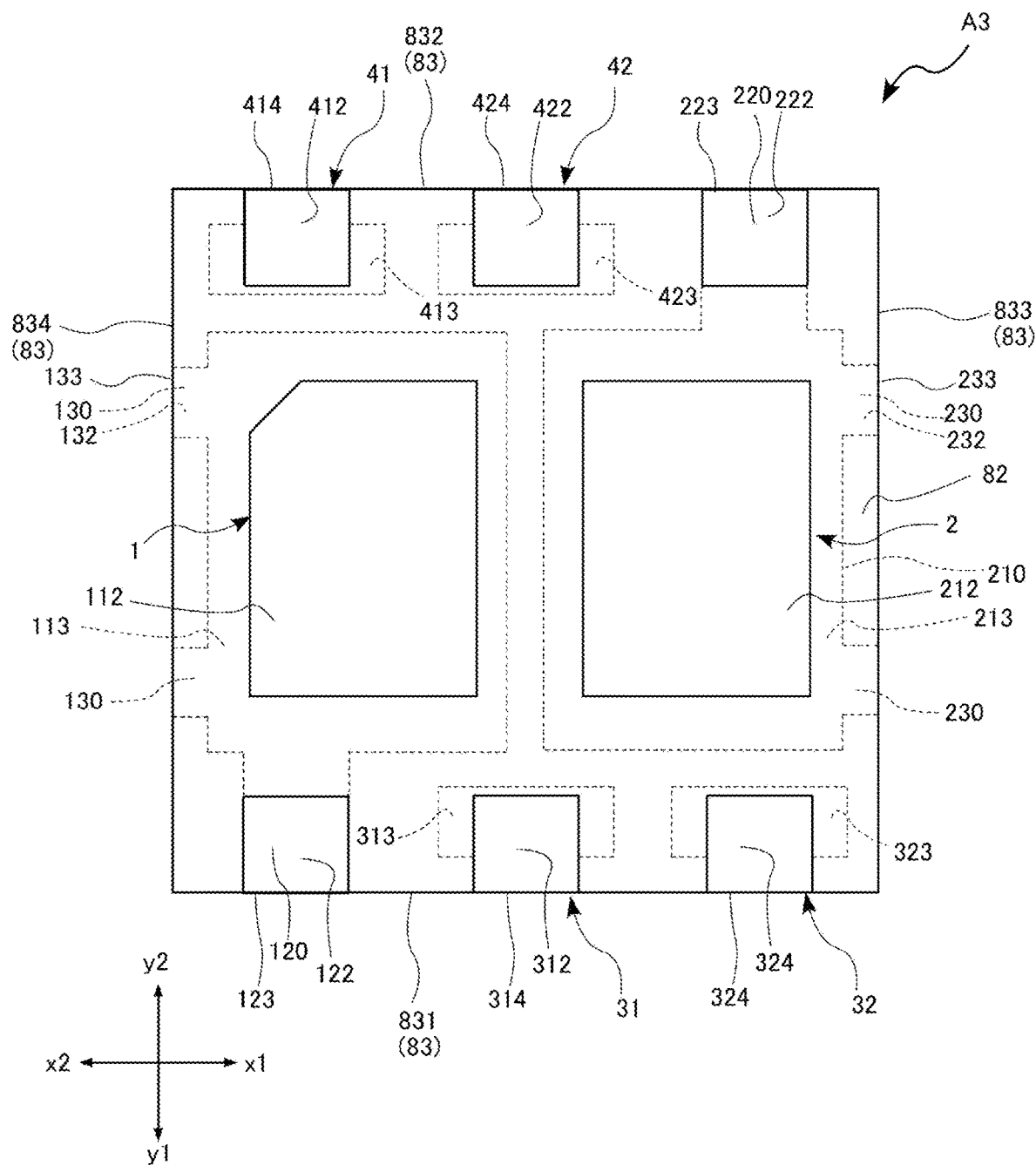
FIG. 11 is a bottom view showing the semiconductor device of FIG. 10.

FIGS. 10 and 11 are diagrams for explaining a semiconductor device A3 according to a third embodiment of the present disclosure. FIG. 10 is a plan view showing the semiconductor device A3. FIG. 10 corresponds to FIG. 3. In FIG. 10, for the sake of convenience of understanding, the sealing resin 8 is transparent and an outer shape of the sealing resin 8 is shown by an imaginary line (two-dot chain line). FIG. 11 is a bottom view showing the semiconductor device A3. FIG. 11 corresponds to FIG. 4. The semiconductor device A3 according to the third embodiment is different from the semiconductor device A1 according to the first embodiment in that the former has a different shape of the third lead 31 and further includes a fourth lead 32.

The semiconductor device A3 according to the third embodiment includes the third lead 31 having a shape different from that in the first embodiment and further includes the fourth lead 32. The third lead 31 and the fourth lead 32 according to the third embodiment are obtained by dividing the third lead 31 according to the first embodiment into two leads in the x direction, and have the same shapes as those of the fifth lead 41 and the sixth lead 42, respectively. The third lead 31 according to the third embodiment has substantially a rectangular shape when viewed in the z direction. The fourth lead 32 has substantially a rectangular shape when viewed in the z direction and has a main surface 321, a back surface 322, a back surface side recess 323, and an end surface 324. The third lead 31 and the fourth lead 32 according to the third embodiment are separated and insulated from each other in the semiconductor device A3. When viewed in the z direction, the fourth lead 32 is disposed at a corner portion (an upper right corner portion in FIG. 10) of the semiconductor device A3 on the y1 side in the y direction and the x1 side in the x direction. When viewed in the z direction, the third lead 31 according to the third embodiment is disposed at an end portion of the semiconductor device A3 on the y1 side in the y direction, and is located between the fourth lead 32 and the terminal portion 120 of the first lead 1 in the x direction.

Further, in the third embodiment, the first electrode 61 of the semiconductor element 601 is electrically connected to the third lead 31 via the wire 71. As a result, the third lead 31 is electrically connected to the first electrode 61 (the emitter electrode) of the semiconductor element 601 and functions as an emitter terminal of the semiconductor element 601. Further, in the third embodiment, the first electrode 61 of the semiconductor element 602 is electrically connected to the fourth lead 32 via the wire 71. As a result, the fourth lead 32 is electrically connected to the first electrode 61 (the emitter electrode) of the semiconductor element 602 and functions as an emitter terminal of the semiconductor element 601. In the third embodiment, the third lead 31 corresponds to the "first terminal" of the present disclosure, and the fourth lead 32 corresponds to the "second terminal" of the present disclosure.

According to the third embodiment, the first electrode 61 of the semiconductor element 601 is electrically connected to the third lead 31 by the wire 71. The first electrode 61 of the semiconductor element 602 is electrically connected to the fourth lead 32 by the wire 71. The third lead 31 and the fourth lead 32 are arranged adjacent to each other on the y1 side of the first lead 1 and the second lead 2 in the y direction. Further, the second electrode 62 of the semiconductor element 601 is electrically connected to the fifth lead 41 by the wire 72. The second electrode 62 of the semiconductor element 602 is electrically connected to the sixth lead 42 by the wire 72. The fifth lead 41 and the sixth lead 42 are arranged adjacent to each other on the y2 side of the first lead 1 and the second lead 2 in the y direction. Therefore, in the wiring board 9 on which the semiconductor device A3 is mounted, the wiring 92 connected to the third lead 31 and the fourth lead 32 and the wiring 94 connected to the fifth lead 41 and the sixth lead 42 become simple wirings.

Further, the semiconductor device A3 has the same effects as the semiconductor device A1 by adopting the configurations common with the semiconductor device A1.

Fourth Embodiment

Figure 12:
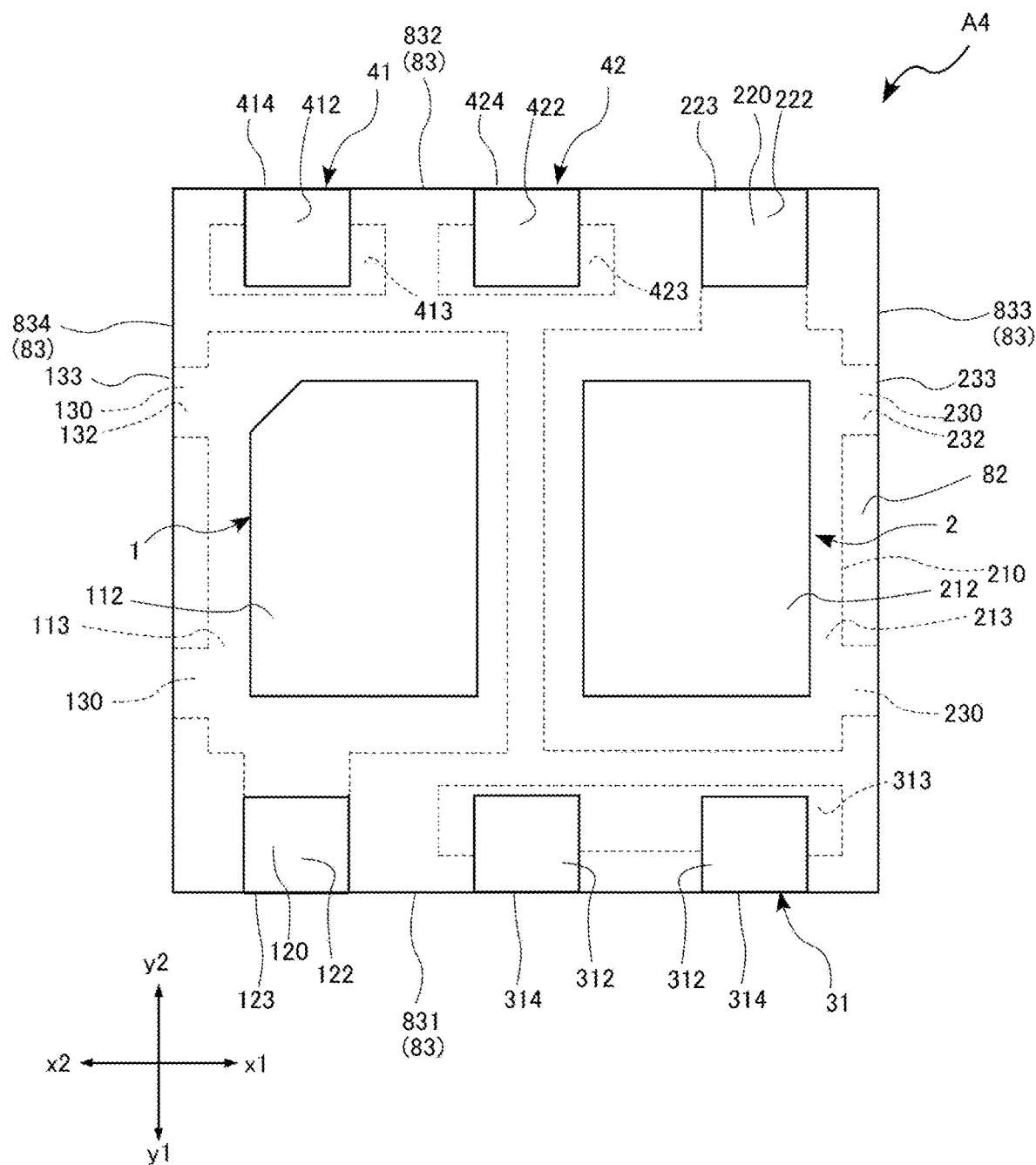
FIG. 12 is a bottom view showing a semiconductor device according to a fourth embodiment of the present disclosure.

FIG. 12 is a bottom view showing a semiconductor device A4 according to a fourth embodiment of the present disclosure. FIG. 12 corresponds to FIG. 4. The semiconductor device A4 according to the fourth embodiment is different from the semiconductor device A1 according to the first embodiment in that the former has a different shape of the third lead 31.

In the third lead 31 according to the fourth embodiment, the back surface 312 includes two portions separated by the resin back surface 82.

Also in the fourth embodiment, the first electrode 61 of the semiconductor element 601 and the first electrode 61 of the semiconductor element 602 are electrically connected to the third lead 31 by the wires 71, respectively. Further, the second electrode 62 of the semiconductor element 601 is electrically connected to the fifth lead 41 by the wire 72. The second electrode 62 of the semiconductor element 602 is electrically connected to the sixth lead 42 by the wire 72. The fifth lead 41 and the sixth lead 42 are arranged adjacent to each other on the y2 side of the first lead 1 and the second lead 2 in the y direction. Therefore, in the wiring board 9 on which the semiconductor device A4 is mounted, the wiring 92 connected to the third lead 31 and the wiring 94 connected to the fifth lead 41 and the sixth lead 42 become simple wirings.

Further, also in the fourth embodiment, the third lead 31 has a wide integrated main surface 311. Therefore, it is possible to bond a larger number of wires 71 to the third lead 31 as compared with a case where the main surface 311 is divided into a plurality of portions. Further, according to the fourth embodiment, the back surface 312 of the third lead 31 is composed of two portions separated by the resin back surface 82. That is, the back surface side recess 313 is covered with the sealing resin 8 between the two portions of the back surface 312. As a result, it is possible to further prevent the third lead 31 from peeling from the sealing resin 8 toward the z2 side in the z direction, as compared with the case of the first embodiment.

Further, the semiconductor device A4 has the same effects as the semiconductor device A1 by adopting the configurations common with the semiconductor device A1.

Fifth Embodiment

Figure 13:
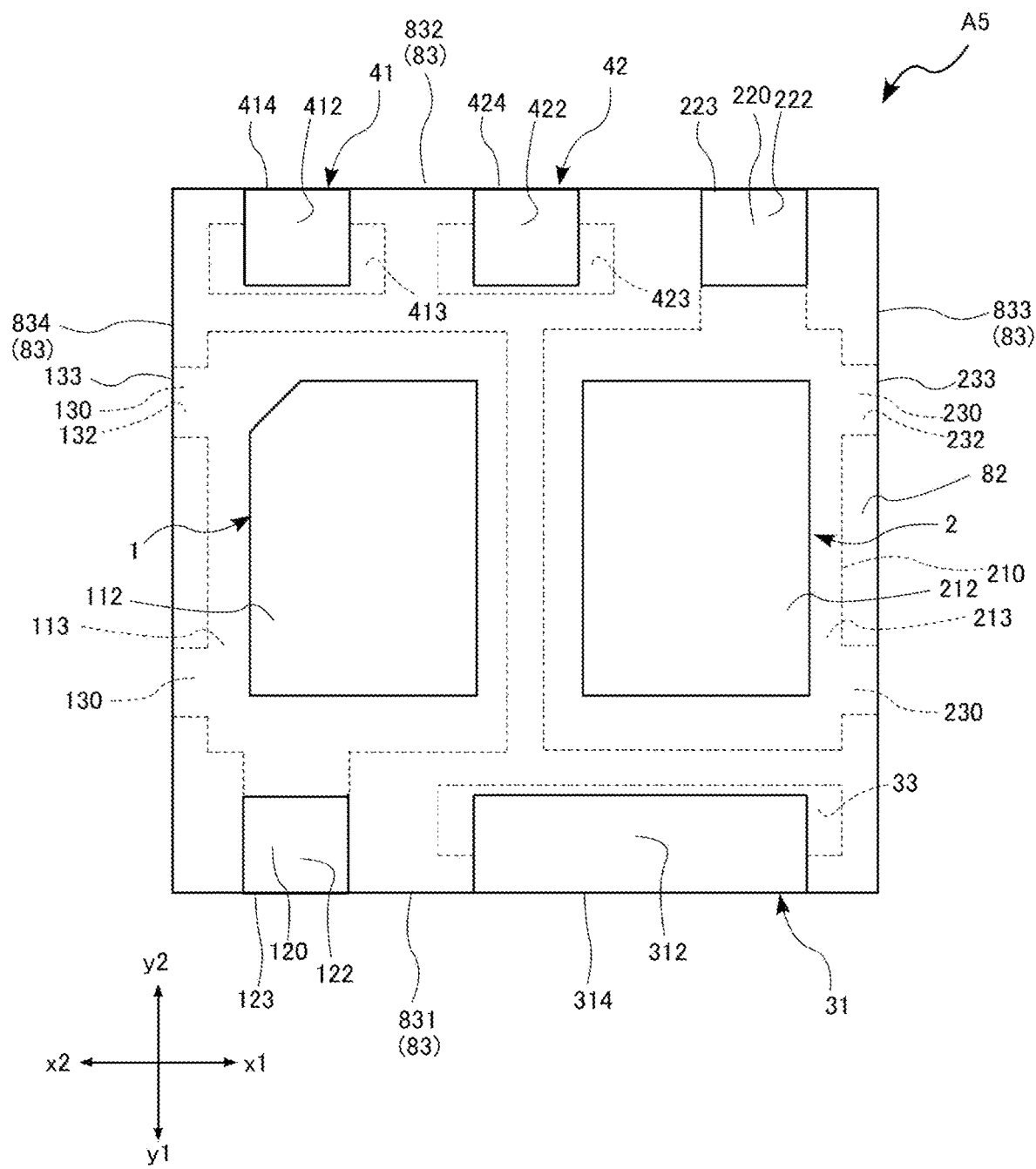
FIG. 13 is a bottom view showing a semiconductor device according to a fifth embodiment of the present disclosure.

FIG. 13 is a bottom view showing a semiconductor device A5 according to a fifth embodiment of the present disclosure. FIG. 13 corresponds to FIG. 4. The semiconductor device A5 according to the fifth embodiment is different from the semiconductor device A1 according to the first embodiment in that the former has a different shape of the third lead 31.

The third lead 31 according to the fifth embodiment is obtained by eliminating a portion, which is recessed from the end surface 314 in the y direction, in the third lead 31 according to the first embodiment. That is, the third lead 31 according to the fifth embodiment has a shape in which the dimension of the fifth lead 41 (or the sixth lead 42) in the x direction is increased. The back surface 312 of the third lead 31 in the first embodiment has a U-shape in which the y1 side in they direction is opened, whereas the back surface 312 of the third lead 31 in the fifth embodiment has an elongated rectangular shape extending to the edge of the resin back surface 82 on the y1 side in the y direction. The shape of the end surface 314 of the third lead 31 in the first embodiment is divided into two portions, whereas the shape of the end surface 314 of the third lead 31 in the fifth embodiment is an integrated elongated rectangular shape extending in the x direction.

Also in the fifth embodiment, the first electrode 61 of the semiconductor element 601 and the first electrode 61 of the semiconductor element 602 are electrically connected to the third lead 31 by the wires 71, respectively. Further, the second electrode 62 of the semiconductor element 601 is electrically connected to the fifth lead 41 by the wire 72. The second electrode 62 of the semiconductor element 602 is electrically connected to the sixth lead 42 by the wire 72. The fifth lead 41 and the sixth lead 42 are arranged adjacent to each other on the y2 side of the first lead 1 and the second lead 2 in the y direction. Therefore, in the wiring board 9 on which the semiconductor device A5 is mounted, the wiring 92 connected to the third lead 31 and the wiring 94 connected to the fifth lead 41 and the sixth lead 42 become simple wirings.

Further, also in the fifth embodiment, the third lead 31 has a wide integrated main surface 311. Therefore, it is possible to bond a larger number of wires 71 to the third lead 31 as compared with a case where the main surface 311 is divided into a plurality of portions. Further, according to the fifth embodiment, the back surface 312 of the third lead 31 has an elongated rectangular shape extending to the edge of the resin back surface 82 on the y1 side in the y direction. Therefore, a region in which the wires 71 can be stably bonded is wider than that in the case of the first embodiment.

Further, the semiconductor device A5 has the same effects as the semiconductor device A1 by adopting the configurations common with the semiconductor device A1.

In the fifth embodiment, the case where the dimensions of the back surface 312 and the end surface 314 of the third lead 31 in the x direction are about three times as large as the dimensions of the back surface 412 and the end surface 414 of the fifth lead 41 in the x direction has been described, but the fifth embodiment is not limited thereto. For example, the dimensions of the back surface 312 and the end surface 314 of the third lead 31 in the x direction may be about the same as the dimensions of the back surface 412 and the end surface 414 of the fifth lead 41 in the x direction.

Sixth Embodiment

Figure 14:
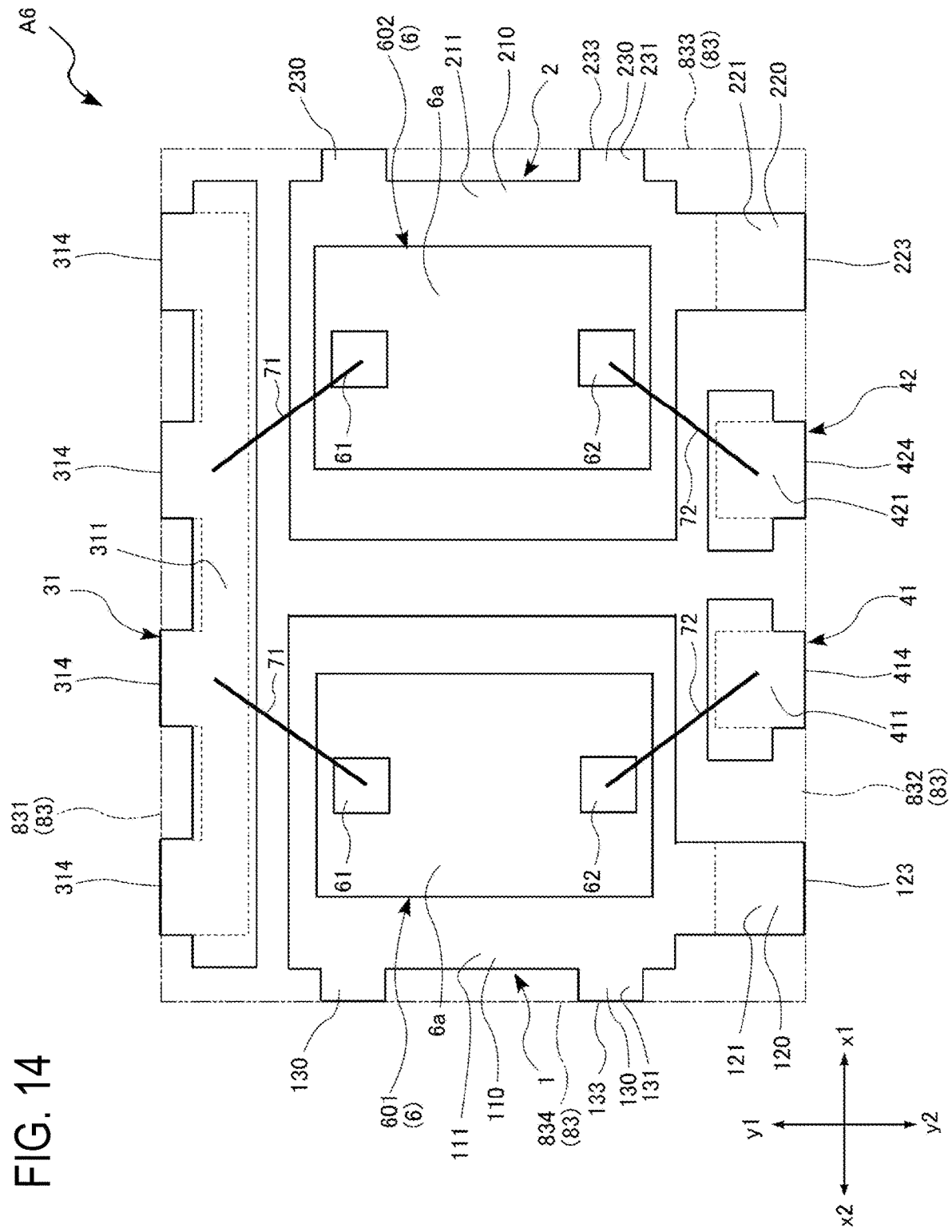
FIG. 14 is a plan view showing a semiconductor device according to a sixth embodiment of the present disclosure.

FIG. 14 is a plan view showing a semiconductor device A6 according to a sixth embodiment of the present disclosure. FIG. 14 corresponds to FIG. 3. In FIG. 14, for the sake of convenience of understanding, the sealing resin 8 is transparent and an outer shape of the sealing resin 8 is shown by an imaginary line (two-dot chain line). The semiconductor device A6 according to the sixth embodiment is different from the semiconductor device A1 according to the first embodiment in that the first lead 1 and the second lead 2 are exposed from the same second resin side surface 832.

In the first lead 1 according to the sixth embodiment, the terminal portion 120 is disposed on the y2 side of the die pad portion 110 in the y direction and located biased to the x2 side in the x direction. The fifth lead 41 and the sixth lead 42 are interposed between the terminal portion 120 of the first lead 1 and the terminal portion 220 of the second lead 2. The third lead 31 extends to the vicinity of both end portions of the semiconductor device A6 in the x direction.

Also in the sixth embodiment, the first electrode 61 of the semiconductor element 601 and the first electrode 61 of the semiconductor element 602 are electrically connected to the third lead 31 by the wires 71, respectively. Further, the second electrode 62 of the semiconductor element 601 is electrically connected to the fifth lead 41 by the wire 72. The second electrode 62 of the semiconductor element 602 is electrically connected to the sixth lead 42 by the wire 72. The fifth lead 41 and the sixth lead 42 are arranged adjacent to each other on the y2 side of the first lead 1 and the second lead 2 in the y direction. Therefore, in the wiring board 9 on which the semiconductor device A6 is mounted, the wiring 92 connected to the third lead 31 and the wiring 94 connected to the fifth lead 41 and the sixth lead 42 become simple wirings. Further, the semiconductor device A6 has the same effects as the semiconductor device A1 by adopting the configurations common with the semiconductor device A1.

In the sixth embodiment, the case where the terminal portion 120 of the first lead 1 and the terminal portion 220 of the second lead 2 are both arranged on the y2 side in the y direction and are exposed from the second resin side surface 832 has been described, but the sixth embodiment is not limited thereto. The terminal portion 120 of the first lead 1 and the terminal portion 220 of the second lead 2 may both be arranged on the y1 side in the y direction and may be exposed from the first resin side surface 831. In this case, the third lead 31 may be interposed between the terminal portion 120 of the first lead 1 and the terminal portion 220 of the second lead 2. Further, the terminal portion 120 of the first lead 1 may be disposed on the x2 side of the die pad portion 110 in the x direction and may be exposed from the fourth resin side surface 834. Further, the terminal portion 220 of the second lead 2 may be disposed on the x1 side of the die pad portion 210 in the x direction and may be exposed from the third resin side surface 833. Further, in contrast to the semiconductor device A1 according to the first embodiment, the terminal portion 120 of the first lead 1 may be disposed on the y2 side of the die pad portion 110 in the y direction and may be exposed from the second resin side surface 832, and the terminal portion 220 of the second lead 2 may be disposed on the y1 side of the die pad portion 210 in they direction and may be exposed from the first resin side surface 831.

Seventh Embodiment

Figure 15:
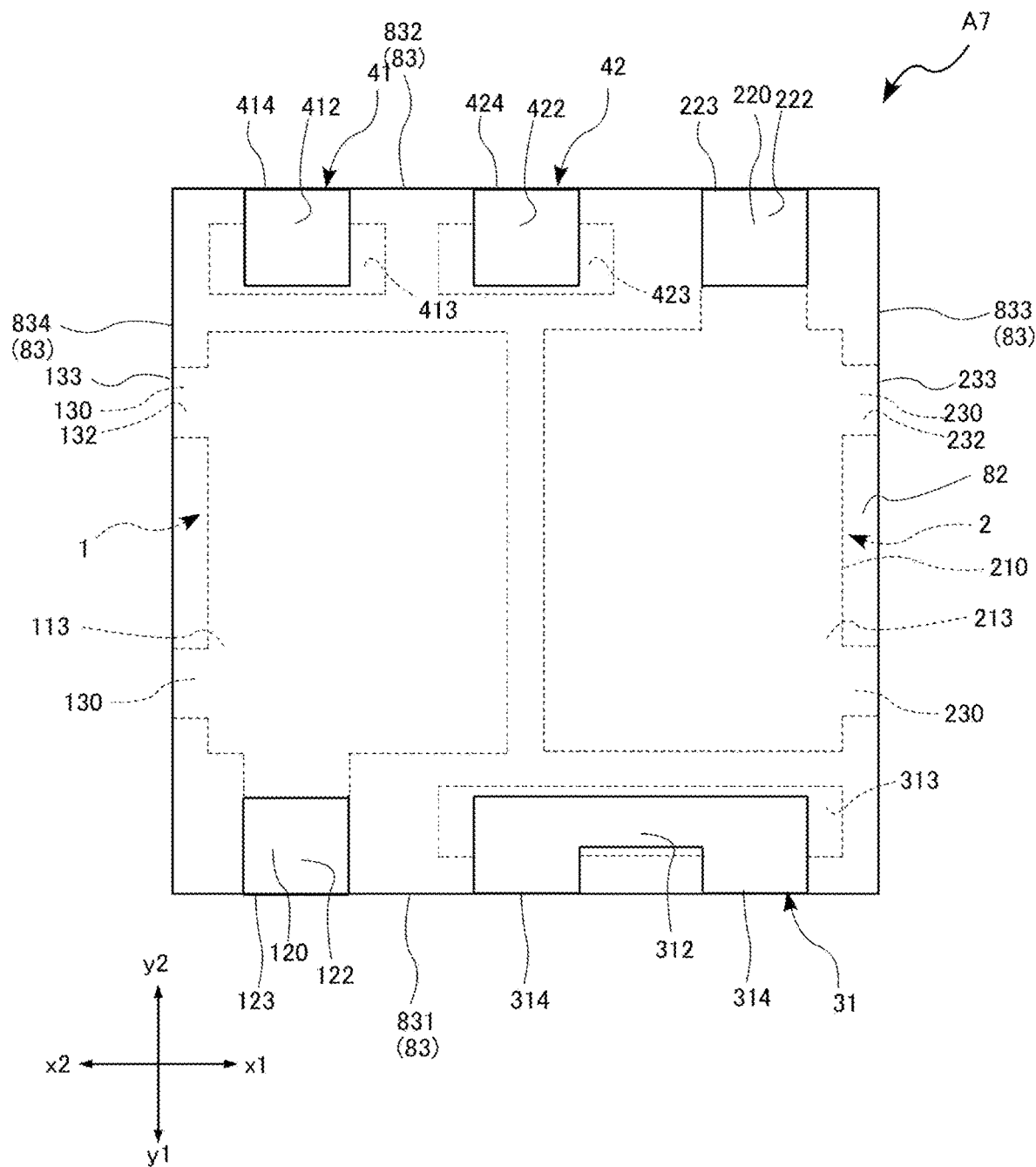
FIG. 15 is a bottom view showing a semiconductor device according to a seventh embodiment of the present disclosure.

FIG. 15 is a bottom view showing a semiconductor device A7 according to a seventh embodiment of the present disclosure. FIG. 15 corresponds to FIG. 4. The semiconductor device A7 according to the seventh embodiment is different from the semiconductor device A1 according to the first embodiment in that the former has different shapes of the first lead 1 and the second lead 2.

In the first lead 1 according to the seventh embodiment, the die pad portion 110 does not have the die pad portion back surface 112, and the die pad portion 110 is not exposed from the resin back surface 82. Further, in the second lead 2 according to the seventh embodiment, the die pad portion 210 does not have the die pad portion back surface 212, and the die pad portion 210 is not exposed from the resin back surface 82.

Also in the seventh embodiment, the first electrode 61 of the semiconductor element 601 and the first electrode 61 of the semiconductor element 602 are electrically connected to the third lead 31 by the wires 71, respectively. Further, the second electrode 62 of the semiconductor element 601 is electrically connected to the fifth lead 41 by the wire 72. The second electrode 62 of the semiconductor element 602 is electrically connected to the sixth lead 42 by the wire 72. The fifth lead 41 and the sixth lead 42 are arranged adjacent to each other on the y2 side of the first lead 1 and the second lead 2 in the y direction. Therefore, in the wiring board 9 on which the semiconductor device A7 is mounted, the wiring 92 connected to the third lead 31 and the wiring 94 connected to the fifth lead 41 and the sixth lead 42 become simple wirings.

Further, according to the seventh embodiment, the die pad portion 110 of the first lead 1 and the die pad portion 210 of the second lead 2 are not exposed from the resin back surface 82. Therefore, it is possible to prevent the first lead 1 from being short-circuited with the leads 2, 31, 41, and 42, or the second lead 2 from being short-circuited with the leads 1, 31, 41, and 42. Further, the semiconductor device A7 has the same effects as the semiconductor device A1 by adopting the configurations common with the semiconductor device A1.

Eighth Embodiment

Figure 16:
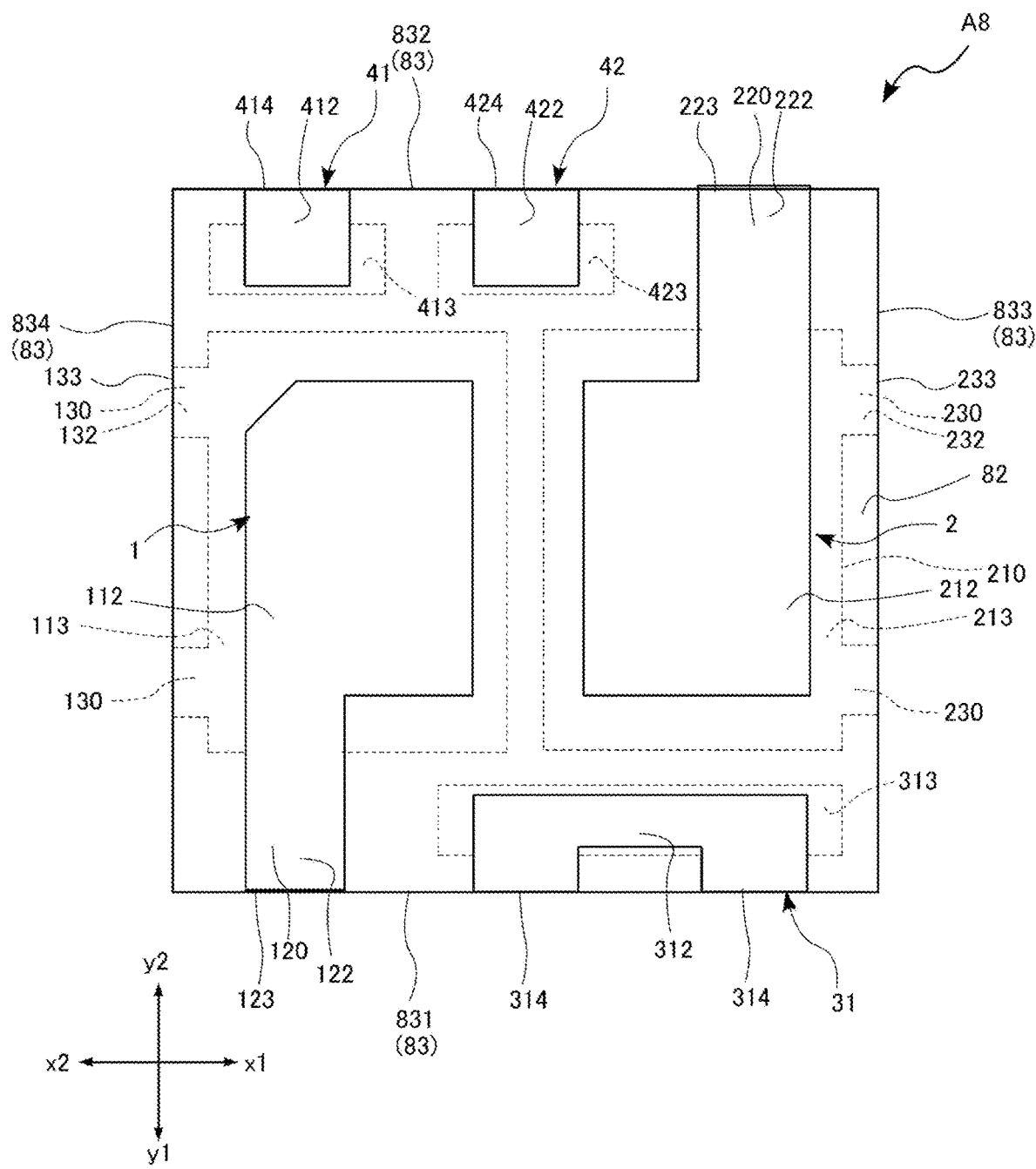
FIG. 16 is a bottom view showing a semiconductor device according to an eighth embodiment of the present disclosure.

FIG. 16 is a bottom view showing a semiconductor device A8 according to an eighth embodiment of the present disclosure. FIG. 16 corresponds to FIG. 4. The semiconductor device A8 according to the eighth embodiment is different from the semiconductor device A1 according to the first embodiment in that the former has different shapes of the first lead 1 and the second lead 2.

In the first lead 1 according to the eighth embodiment, the die pad portion back surface 112 and the terminal portion back surface 122 are connected to each other. Further, in the second lead 2 according to the eighth embodiment, the die pad portion back surface 212 and the terminal portion back surface 222 are connected to each other.

Also in the eighth embodiment, the first electrode 61 of the semiconductor element 601 and the first electrode 61 of the semiconductor element 602 are electrically connected to the third lead 31 by the wires 71, respectively. Further, the second electrode 62 of the semiconductor element 601 is electrically connected to the fifth lead 41 by the wire 72. The second electrode 62 of the semiconductor element 602 is electrically connected to the sixth lead 42 by the wire 72. The fifth lead 41 and the sixth lead 42 are arranged adjacent to each other on the y2 side of the first lead 1 and the second lead 2 in the y direction. Therefore, in the wiring board 9 on which the semiconductor device A8 is mounted, the wiring 92 connected to the third lead 31 and the wiring 94 connected to the fifth lead 41 and the sixth lead 42 become simple wirings.

Further, according to the eighth embodiment, the die pad portion back surface 112 is expanded until it is connected to the terminal portion back surface 122, and the die pad portion back surface 212 is expanded until it is connected to the terminal portion back surface 222. Therefore, the heat dissipation function is further improved over the case of the first embodiment. Further, the semiconductor device A8 has the same effects as the semiconductor device A1 by adopting the configurations common with the semiconductor device A1.

Ninth Embodiment

Figure 17:
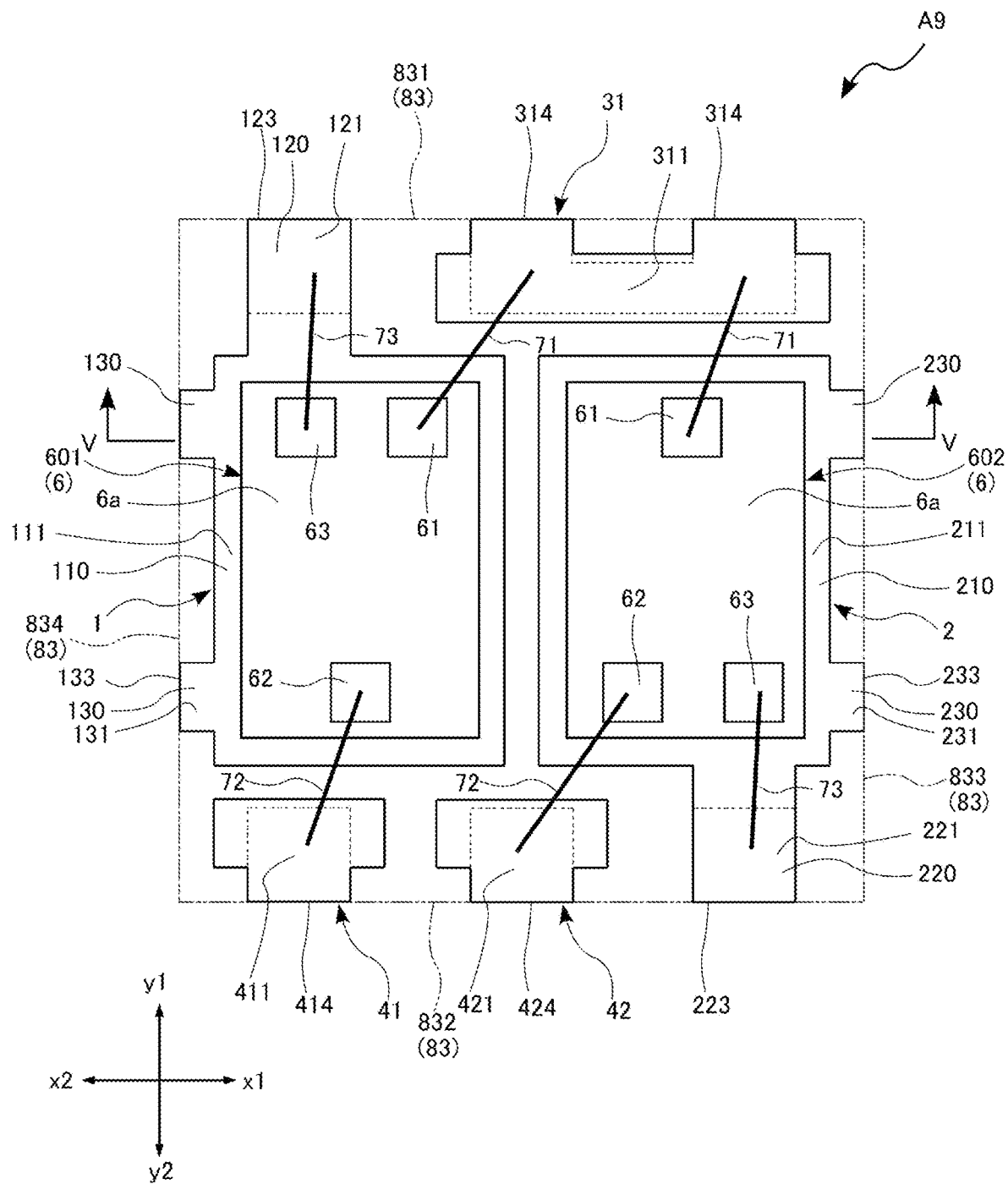
FIG. 17 is a plan view showing a semiconductor device according to a ninth embodiment of the present disclosure.

FIG. 17 is a plan view showing a semiconductor device A9 according to a ninth embodiment of the present disclosure. FIG. 17 corresponds to FIG. 3. In FIG. 17, for the sake of convenience of understanding, the sealing resin 8 is transparent and an outer shape of the sealing resin 8 is shown by an imaginary line (two-dot chain line). The semiconductor device A9 according to the ninth embodiment is different from the semiconductor device A1 according to the first embodiment in that the former has a different configuration of each semiconductor element 6.

In each semiconductor element 6 according to the ninth embodiment, the third electrode 63 is disposed not on the element back surface 6b but on the element main surface 6a. The arrangement positions of the first electrode 61, the second electrode 62, and the third electrode 63 on the element main surface 6a are not particularly limited. In addition, the semiconductor device A9 further includes wires 73. The wires 73 are formed of the same material as the wires 71 and 72. One wire 73 is connected to the third electrode 63 of the semiconductor element 601 and the terminal portion main surface 121 of the first lead 1. As a result, the first lead 1 is electrically connected to the third electrode 63 (the collector electrode) of the semiconductor element 601 and functions as a collector terminal of the semiconductor element 601. In the ninth embodiment, the third electrode 63 of the semiconductor element 601 is connected to the terminal portion main surface 121 by one wire 73, but may be connected by a plurality of wires 73. The other wire 73 is connected to the third electrode 63 of the semiconductor element 602 and the terminal portion main surface 221 of the second lead 2. As a result, the second lead 2 is electrically connected to the third electrode 63 (the collector electrode) of the semiconductor element 602 and functions as a collector terminal of the semiconductor element 602. In the ninth embodiment, the third electrode 63 of the semiconductor element 602 is connected to the terminal portion main surface 221 by one wire 73, but may be connected by a plurality of wires 73. In the case of the ninth embodiment, the bonding material 75 (not shown in FIG. 17) may be an insulating bonding material.

Also in the ninth embodiment, the first electrode 61 of the semiconductor element 601 and the first electrode 61 of the semiconductor element 602 are electrically connected to the third lead 31 by the wires 71, respectively. Further, the second electrode 62 of the semiconductor element 601 is electrically connected to the fifth lead 41 by the wire 72. The second electrode 62 of the semiconductor element 602 is electrically connected to the sixth lead 42 by the wire 72. The fifth lead 41 and the sixth lead 42 are arranged adjacent to each other on the y2 side of the first lead 1 and the second lead 2 in the y direction. Therefore, in the wiring board 9 on which the semiconductor device A9 is mounted, the wiring 92 connected to the third lead 31 and the wiring 94 connected to the fifth lead 41 and the sixth lead 42 become simple wirings. Further, the semiconductor device A9 has the same effects as the semiconductor device A1 by adopting the configurations common with the semiconductor device A1.

Tenth Embodiment

Figure 18:
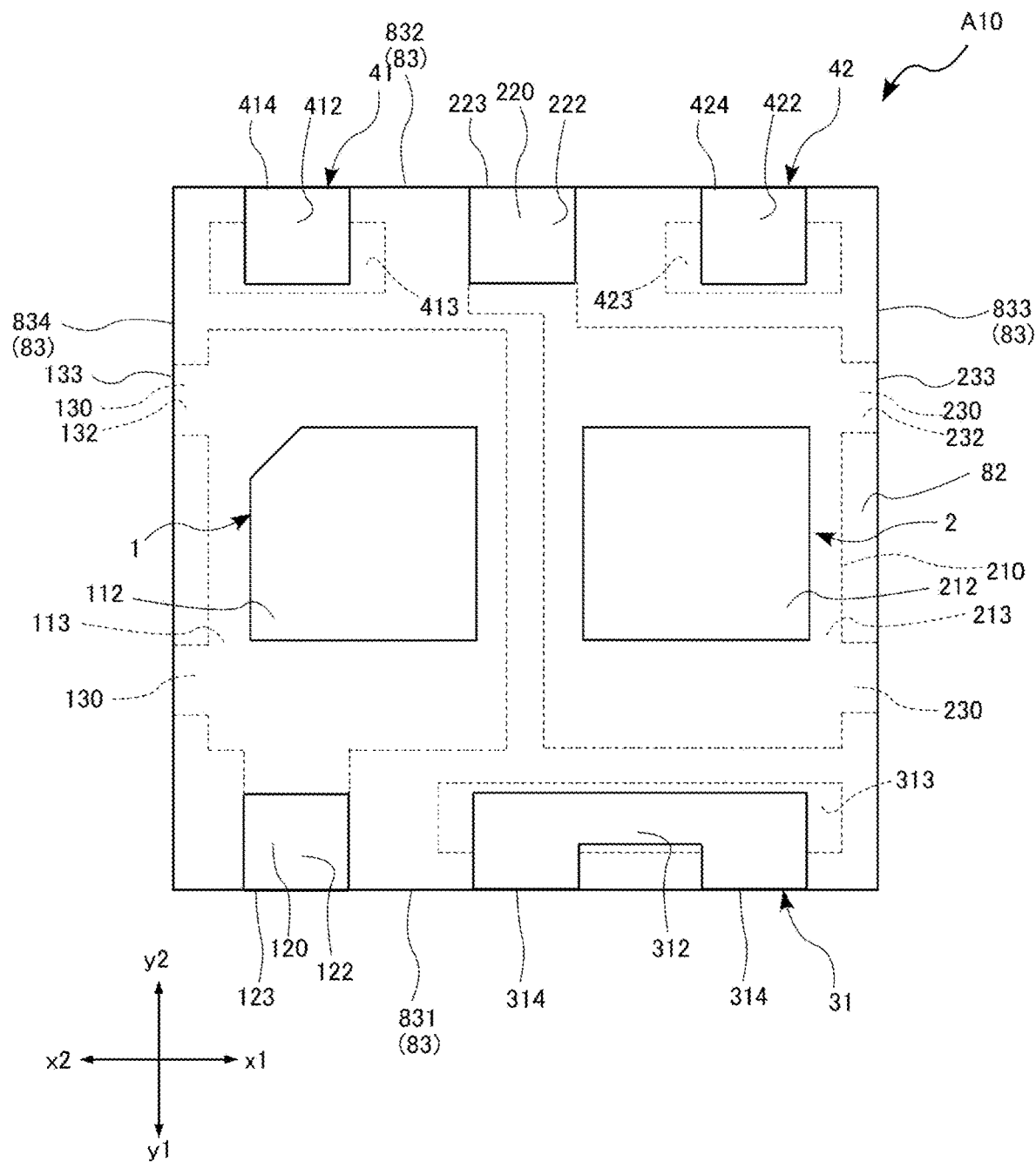
FIG. 18 is a bottom view showing a semiconductor device according to a tenth embodiment of the present disclosure.
Figure 19:
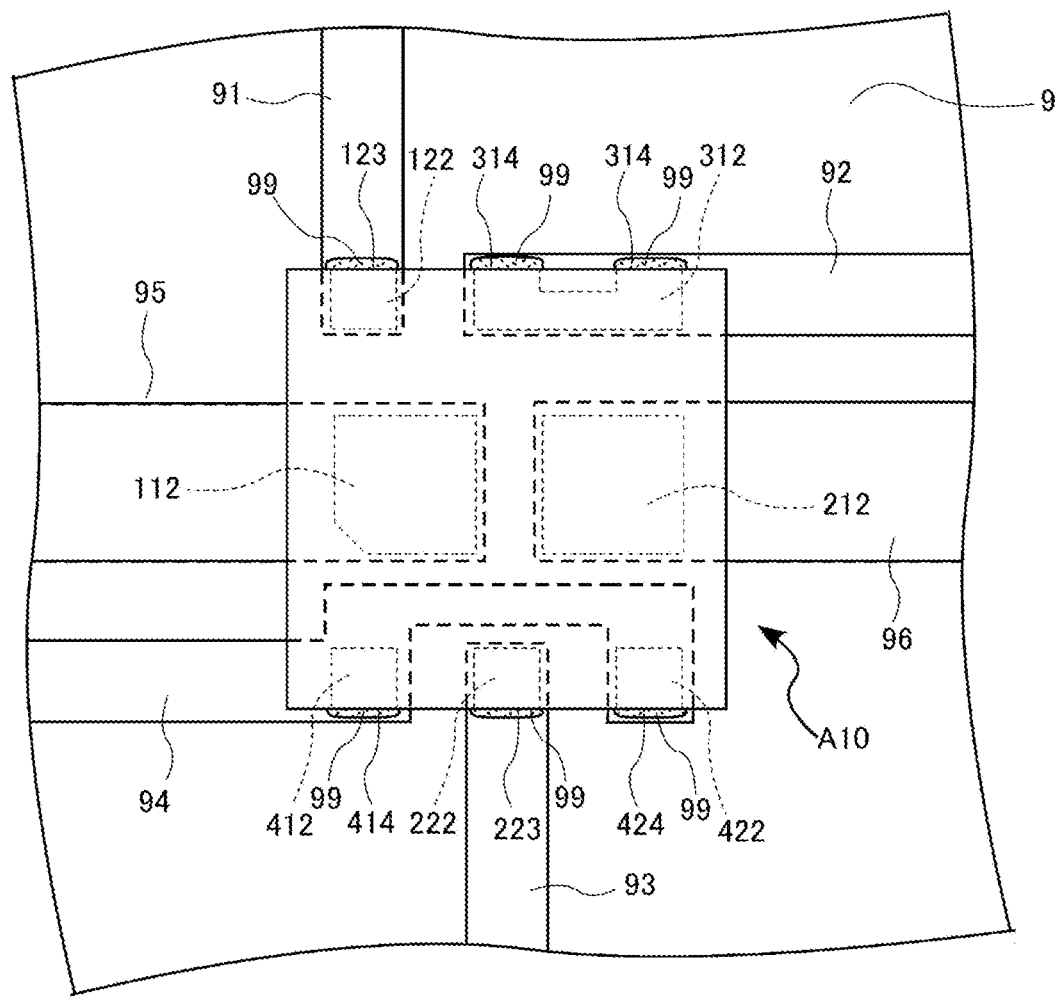
FIG. 19 is a diagram showing a mounting state of the semiconductor device of FIG. 18 on a wiring board.

FIGS. 18 and 19 are diagrams for explaining a semiconductor device A10 according to a tenth embodiment of the present disclosure. FIG. 18 is a bottom view showing the semiconductor device A10. FIG. 18 corresponds to FIG. 4. FIG. 19 is a diagram showing a mounting state of the semiconductor device A10 on the wiring board 9. FIG. 19 corresponds to FIG. 8. The semiconductor device A10 according to the tenth embodiment is different from the semiconductor device A1 according to the first embodiment in terms of the arrangement positions of the terminal portion 220 of the second lead 2 and the sixth lead 42.

In the second lead 2 according to the tenth embodiment, the terminal portion 220 is disposed on the y2 side of the die pad portion 210 in the y direction and located biased to the x2 side in the x direction. When viewed in the z direction, the sixth lead 42 according to the tenth embodiment is disposed at a corner portion (an upper right corner portion in FIG. 18) of the semiconductor device A10 on the y2 side in the y direction and the x1 side in the x direction. That is, both the fifth lead 41 and the sixth lead 42 are arranged on the y2 side in the y direction with respect to the first lead 1 and the second lead 2, but are not adjacent to each other. In the x direction, the terminal portion 220 of the second lead 2 is interposed between the fifth lead 41 and the sixth lead 42.

As shown in FIG. 19, the semiconductor device A10 is mounted on the wiring board 9. In the semiconductor device A10 shown in FIG. 19, for the sake of convenience of understanding, the surfaces of the leads 1, 2, 31, 41, and 42 exposed from the resin back surface 82 are indicated by broken lines. As shown in FIG. 19, the semiconductor device A10 is mounted on the wiring board 9, and the leads 1, 2, 31, 41, and 42 are bonded to the wirings 91 to 96 formed on the wiring board 9 by solder portions 99. In the tenth embodiment, the wiring 94 is formed so as to bypass the y1 side of the wiring 93 in the y direction, and the fifth lead 41 and the sixth lead 42 are bonded to each other.

Also in the tenth embodiment, the first electrode 61 of the semiconductor element 601 and the first electrode 61 of the semiconductor element 602 are electrically connected to the third lead 31 by the wires 71, respectively. Therefore, in the wiring board 9 on which the semiconductor device A10 is mounted, the wiring 92 connected to the third lead 31 becomes a simple wiring. Further, the second electrode 62 of the semiconductor element 601 is electrically connected to the fifth lead 41 by the wire 72. The second electrode 62 of the semiconductor element 602 is electrically connected to the sixth lead 42 by the wire 72. The fifth lead 41 and the sixth lead 42 are arranged on the y2 side of the first lead 1 and the second lead 2 in the y direction. Therefore, in the wiring board 9 on which the semiconductor device A10 is mounted, the wiring 94 connected to the fifth lead 41 and the sixth lead 42 becomes a simple wiring as compared with a case where the fifth lead 41 and the sixth lead 42 are arranged on opposite sides to the first lead 1 and the second lead 2 in the y direction. Further, the semiconductor device A10 has the same effects as the semiconductor device A1 by adopting the configurations common with the semiconductor device A1.

The semiconductor devices according to the present disclosure are not limited to the above-described embodiments. The specific configurations of parts of the semiconductor devices according to the present disclosure can be freely changed in design in various ways.

[Supplementary Note 1]

A semiconductor device including:

a first semiconductor element and a second semiconductor element, each of which is a switching element and has an element main surface and an element back surface facing opposite to each other in a thickness direction, and a first electrode and a second electrode arranged on the element main surface;

a first lead on which the first semiconductor element is mounted, the first lead being electrically connected to the first semiconductor element;

a second lead on which the second semiconductor element is mounted, the second lead being electrically connected to the second semiconductor element;

a sealing resin that covers the first semiconductor element and the second semiconductor element;

a first terminal disposed apart from the first lead and the second lead in a first direction orthogonal to the thickness direction, exposed from the sealing resin, and electrically connected to the first electrode of the first semiconductor element;

a second terminal disposed apart from the first lead and the second lead on the same side as the first terminal in the first direction, exposed from the sealing resin, and electrically connected to the first electrode of the second semiconductor element;

a third terminal disposed apart from the first lead and the second lead on the opposite side to the first terminal in the first direction, the third terminal being exposed from the sealing resin and electrically connected to the second electrode of the first semiconductor element; and a fourth terminal disposed apart from the first lead and the second lead on the same side as the third terminal in the first direction, exposed from the sealing resin, and electrically connected to the second electrode of the second semiconductor element.

[Supplementary Note 2]

The semiconductor device of Supplementary Note 1, wherein the sealing resin has a resin main surface and a resin back surface facing opposite to each other in the thickness direction, a first resin side surface which is connected to the resin main surface and the resin back surface and from which the first terminal and the second terminal are exposed, and a second resin side surface which is connected to the resin main surface and the resin back surface and from which the third terminal and the fourth terminal are exposed.

[Supplementary Note 3]

The semiconductor device of Supplementary Note 2, wherein the first lead is exposed from the first resin side surface, and the second lead is exposed from the second resin side surface.

[Supplementary Note 4]

The semiconductor device of Supplementary Note 2 or 3, wherein the first lead includes a first die pad portion on which the first semiconductor element is mounted, wherein the second lead includes a second die pad portion on which the second semiconductor element is mounted, and wherein the first die pad portion and the second die pad portion are exposed from the resin back surface.

[Supplementary Note 5]

The semiconductor device of Supplementary Note 4, wherein the first lead further includes a first lead terminal portion connected to the first die pad portion, wherein the second lead further includes a second lead terminal portion connected to the second die pad portion, and wherein the first lead terminal portion and the second lead terminal portion are exposed from the resin back surface.

[Supplementary Note 6]

The semiconductor device of Supplementary Note 5, wherein the first lead terminal portion includes a first terminal portion end surface exposed from the first resin side surface, wherein the second lead terminal portion includes a second terminal portion end surface exposed from the second resin side surface, wherein the first terminal portion end surface is flush with the first resin side surface, and wherein the second terminal portion end surface is flush with the second resin side surface.

[Supplementary Note 7]

The semiconductor device of any one of Supplementary Notes 2 to 6, further including a third lead that is electrically connected to the first electrode of the first semiconductor element and the first electrode of the second semiconductor element, wherein the third lead also serves as the first terminal and the second terminal.

[Supplementary Note 8]

The semiconductor device of Supplementary Note 7, wherein the third lead has a third lead main surface and a third lead back surface facing opposite to each other in the thickness direction, and a third lead end surface that is connected to the third lead main surface and the third lead back surface and is exposed from the first resin side surface.

[Supplementary Note 9]

The semiconductor device of Supplementary Note 8, wherein the third lead end surface is composed of two portions separated by the first resin side surface.

[Supplementary Note 10]

The semiconductor device of Supplementary Note 8 or 9, wherein the third lead back surface has a U-shape.

[Supplementary Note 11]

The semiconductor device of Supplementary Note 8 or 9, wherein the third lead back surface is composed of two portions separated by the resin back surface.

[Supplementary Note 12]

The semiconductor device of any one of Supplementary Notes 2 to 6, further including:

a third lead electrically connected to the first electrode of the first semiconductor element, the third lead serving as the first terminal; and a fourth lead electrically connected to the first electrode of the second semiconductor element and disposed apart from the third lead, the fourth lead serving as the second terminal.

[Supplementary Note 13]

The semiconductor device of Supplementary Note 12, wherein the third lead and the fourth lead are arranged adjacent to each other.

[Supplementary Note 14]

The semiconductor device of any one of Supplementary Notes 2 to 13, further including a fifth lead electrically connected to the second electrode of the first semiconductor element and the second electrode of the second semiconductor element, wherein the fifth lead also serves as the third terminal and the fourth terminal.

[Supplementary Note 15]

The semiconductor device of any one of Supplementary Notes 2 to 13, further including:

a fifth lead electrically connected to the second electrode of the first semiconductor element, the fifth lead serving as the third terminal; and a sixth lead electrically connected to the second electrode of the second semiconductor element and disposed apart from the fifth lead, the sixth lead serving as the fourth terminal.

[Supplementary Note 16]

The semiconductor device of Supplementary Note 15, wherein the fifth lead and the sixth lead are arranged adjacent to each other.

[Supplementary Note 17]

The semiconductor device of any one of Supplementary Notes 1 to 16, further including: a conductive bonding material that bonds the first semiconductor element and the first lead, wherein the first semiconductor element further includes a third electrode disposed on the element back surface, and wherein the third electrode is electrically connected to the first lead via the conductive bonding material.

[Supplementary Note 18]

The semiconductor device of Supplementary Note 17, wherein the first semiconductor element and the second semiconductor element are bipolar transistors, and wherein the first electrode is an emitter electrode, the second electrode is a base electrode, and the third electrode is a collector electrode.

[Supplementary Note 19]

The semiconductor device of Supplementary Note 18, wherein the first semiconductor element is an NPN type, and the second semiconductor element is a PNP type.

[Supplementary Note 20]

The semiconductor device of any one of Supplementary Notes 1 to 19, wherein both of a dimension in the first direction and a dimension in a second direction orthogonal to the thickness direction and the first direction are 1 mm or more and 3 mm or less.

According to the present disclosure in some embodiments, it is possible to simplify wirings on a wiring board on which a semiconductor device is mounted.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
a first semiconductor element and a second semiconductor element, each of which is a switching element and has an element main surface and an element back surface facing opposite to each other in a thickness direction, and a first electrode and a second electrode arranged on the element main surface;
a sealing resin that covers the first semiconductor element and the second semiconductor element;
a first lead on which the first semiconductor element is mounted, the first lead being electrically connected to the first semiconductor element;
a second lead on which the second semiconductor element is mounted, the second lead being electrically connected to the second semiconductor element;
a third lead electrically connected to the first electrode of the first semiconductor element and the first electrode of the second semiconductor element, the third lead comprising:
a first terminal disposed apart from the first lead and the second lead in a first direction orthogonal to the thickness direction, the first terminal being exposed from the sealing resin and electrically connected to the first electrode of the first semiconductor element;
a second terminal disposed apart from the first lead and the second lead on a same side as the first terminal in the first direction, exposed from the sealing resin separately with the first terminal, and electrically connected to the first electrode of the second semiconductor element;
a third terminal disposed apart from the first lead and the second lead on the opposite side to the first terminal in the first direction, exposed from the sealing resin, and electrically connected to the second electrode of the first semiconductor element; and
a fourth terminal disposed apart from the first lead and the second lead on the same side as the third terminal in the first direction, exposed from the sealing resin, and electrically connected to the second electrode of the second semiconductor element.

2. The semiconductor device of claim 1, wherein the sealing resin has a resin main surface and a resin back surface facing opposite to each other in the thickness direction, a first resin side surface which is connected to the resin main surface and the resin back surface and from which the first terminal and the second terminal are exposed, and a second resin side surface which is connected to the resin main surface and the resin back surface and from which the third terminal and the fourth terminal are exposed.

3. The semiconductor device of claim 1, wherein the first lead is exposed from the first resin side surface, and the second lead is exposed from the second resin side surface.

4. The semiconductor device of claim 1,
wherein the first lead includes a first die pad portion on which the first semiconductor element is mounted,
wherein the second lead includes a second die pad portion on which the second semiconductor element is mounted, and
wherein the first die pad portion and the second die pad portion are exposed from the resin back surface.

5. The semiconductor device of claim 4,
wherein the first lead further includes a first lead terminal portion connected to the first die pad portion, wherein the second lead further includes a second lead terminal portion connected to the second die pad portion, and wherein the first lead terminal portion and the second lead terminal portion are exposed from the resin back surface.

6. The semiconductor device of claim 5, wherein the first lead terminal portion includes a first terminal portion end surface exposed from the first resin side surface, wherein the second lead terminal portion includes a second terminal portion end surface exposed from the second resin side surface, wherein the first terminal portion end surface is flush with the first resin side surface, and wherein the second terminal portion end surface is flush with the second resin side surface.

7. The semiconductor device of claim 1, wherein the third lead has a third lead main surface and a third lead back surface facing opposite to each other in the thickness direction, and a third lead end surface that is connected to the third lead main surface and the third lead back surface and is exposed from the first resin side surface.

8. The semiconductor device of claim 7, wherein the third lead end surface is composed of two portions separated by the first resin side surface.

9. The semiconductor device of claim 7, wherein the third lead back surface has a U-shape.

10. The semiconductor device of claim 7, wherein the third lead back surface is composed of two portions separated by the resin back surface.

11. The semiconductor device of claim 1, further comprising:

a fifth lead electrically connected to the second electrode of the first semiconductor element and the second electrode of the second semiconductor element, wherein the fifth lead comprises the third terminal and the fourth terminal which is exposed from the sealing resin separately with the third terminal.

12. The semiconductor device of claim 1, further comprising:

a fifth lead electrically connected to the second electrode of the first semiconductor element, the fifth lead serving as the third terminal; and a sixth lead electrically connected to the second electrode of the second semiconductor element and disposed apart from the fifth lead, the sixth lead serving as the fourth terminal.

13. The semiconductor device of claim 12, wherein the fifth lead and the sixth lead are arranged adjacent to each other.

14. The semiconductor device of claim 1, further comprising:

a conductive bonding material that bonds the first semiconductor element and the first lead, wherein the first semiconductor element further includes a third electrode disposed on the element back surface, and wherein the third electrode is electrically connected to the first lead via the conductive bonding material.

15. The semiconductor device of claim 14, wherein the first semiconductor element and the second semiconductor element are bipolar transistors, and wherein the first electrode is an emitter electrode, the second electrode is a base electrode, and the third electrode is a collector electrode.

16. The semiconductor device of claim 15, wherein the first semiconductor element is an NPN type, and the second semiconductor element is a PNP type.

17. The semiconductor device of claim 1, wherein both of a dimension in the first direction and a dimension in a second direction orthogonal to the thickness direction and the first direction are 1 mm or more and 3 mm or less.

* * * * *